(12) United States Patent
Hosokawa et al.

(10) Patent No.: US 11,705,442 B2
(45) Date of Patent: Jul. 18, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Atsushi Hosokawa, Yokohama Kanagawa (JP); Yasuhisa Shintoku, Fujisawa Kanagawa (JP); Yasukazu Noine, Chigasaki Kanagawa (JP); Yoshiharu Katayama, Oita Oita (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 138 days.

(21) Appl. No.: 17/191,573

(22) Filed: Mar. 3, 2021

(65) Prior Publication Data

US 2022/0084995 A1 Mar. 17, 2022

(30) Foreign Application Priority Data

Sep. 11, 2020 (JP) ................................. 2020-153215

(51) Int. Cl.
*H01L 23/49* (2006.01)
*H01L 25/16* (2023.01)
(Continued)

(52) U.S. Cl.
CPC ........ *H01L 25/16* (2013.01); *H01L 23/49589* (2013.01); *H01L 23/645* (2013.01); *H01L 25/18* (2013.01); *H01L 23/3107* (2013.01); *H01L 24/16* (2013.01); *H01L 24/48* (2013.01); *H01L 24/73* (2013.01); *H01L 2224/16145* (2013.01); *H01L 2224/16265* (2013.01); *H01L 2224/48245* (2013.01); *H01L 2224/48265* (2013.01); *H01L 2224/73207* (2013.01); *H01L 2924/19041* (2013.01); *H01L 2924/19042* (2013.01);
(Continued)

(58) Field of Classification Search
CPC .. H05K 1/18; H05K 1/181–187; H01L 23/48; H01L 23/49589; H01L 23/645; H01L 23/3107; H01L 23/495; H01L 23/49541
USPC .................. 361/764, 772–795; 257/680–690
See application file for complete search history.

(56) References Cited

U.S. PATENT DOCUMENTS 6,611,434 B1 * 8/2003 Lo ........................ H01L 25/0657
361/764
6,670,692 B1 * 12/2003 Shih ..................... H01L 23/5223
257/532

(Continued)

FOREIGN PATENT DOCUMENTS

JP 2763691 B2 6/1998
WO 2018034067 A1 2/2018

*Primary Examiner* — Tuan T Dinh
(74) *Attorney, Agent, or Firm* — Kim & Stewart LLP

(57) ABSTRACT

According to one embodiment, a semiconductor device includes an integrated circuit (IC) chip and a silicon capacitor. The IC chip has a first terminal and a second terminal on a first surface. The silicon capacitor has a first electrode and a second electrode on a second surface facing the first surface. The first electrode is electrically connected to the first terminal through a first conductive member, and the second electrode is electrically connected to the second terminal through a second conductive member.

11 Claims, 22 Drawing Sheets

(51) Int. Cl.
   *H01L 23/64*     (2006.01)
   *H01L 23/495*    (2006.01)
   *H01L 25/18*     (2023.01)
   H01L 23/31       (2006.01)
   H01L 23/00       (2006.01)

(52) U.S. Cl.
   CPC ............... *H01L 2924/19104* (2013.01); *H01L 2924/19105* (2013.01)

(56) References Cited

U.S. PATENT DOCUMENTS

| | | | |
|---|---|---|---|
| 6,873,035 B2 * | 3/2005 | Watanabe | H01L 23/36 257/E23.079 |
| 8,933,747 B2 | 1/2015 | Kang et al. | |
| 2003/0021096 A1 * | 1/2003 | Vinson | H01L 25/0655 361/783 |
| 2008/0017907 A1 * | 1/2008 | Otremba | H01L 27/0629 257/E29.345 |
| 2014/0252551 A1 * | 9/2014 | Dix | H01L 23/642 257/532 |
| 2016/0336311 A1 * | 11/2016 | Kim | H01L 28/91 |

\* cited by examiner

SEMICONDUCTOR DEVICE

CROSS-REFERENCE TO RELATED APPLICATION

This application is based upon and claims the benefit of priority from Japanese Patent Application No. 2020-153215, filed on Sep. 11, 2020, the entire contents of which are incorporated herein by reference.

FIELD

Embodiments described herein relate generally to a semiconductor device.

BACKGROUND

In the related art, a technique of reducing noise of a semiconductor device using a capacitor is known.

DETAILED DESCRIPTION

Embodiments provide a semiconductor device that can reduce noise.

In general, according to one embodiment, a semiconductor device includes an integrated circuit (IC) chip and a first silicon capacitor. The IC chip has a first terminal and a second terminal on a first surface. The first silicon capacitor has a first electrode and a second electrode on a second surface facing the first surface. The first electrode is electrically connected to the first terminal through a first conductive member, and the second electrode is electrically connected to the second terminal through a second conductive member.

First Embodiment

Figure 1:
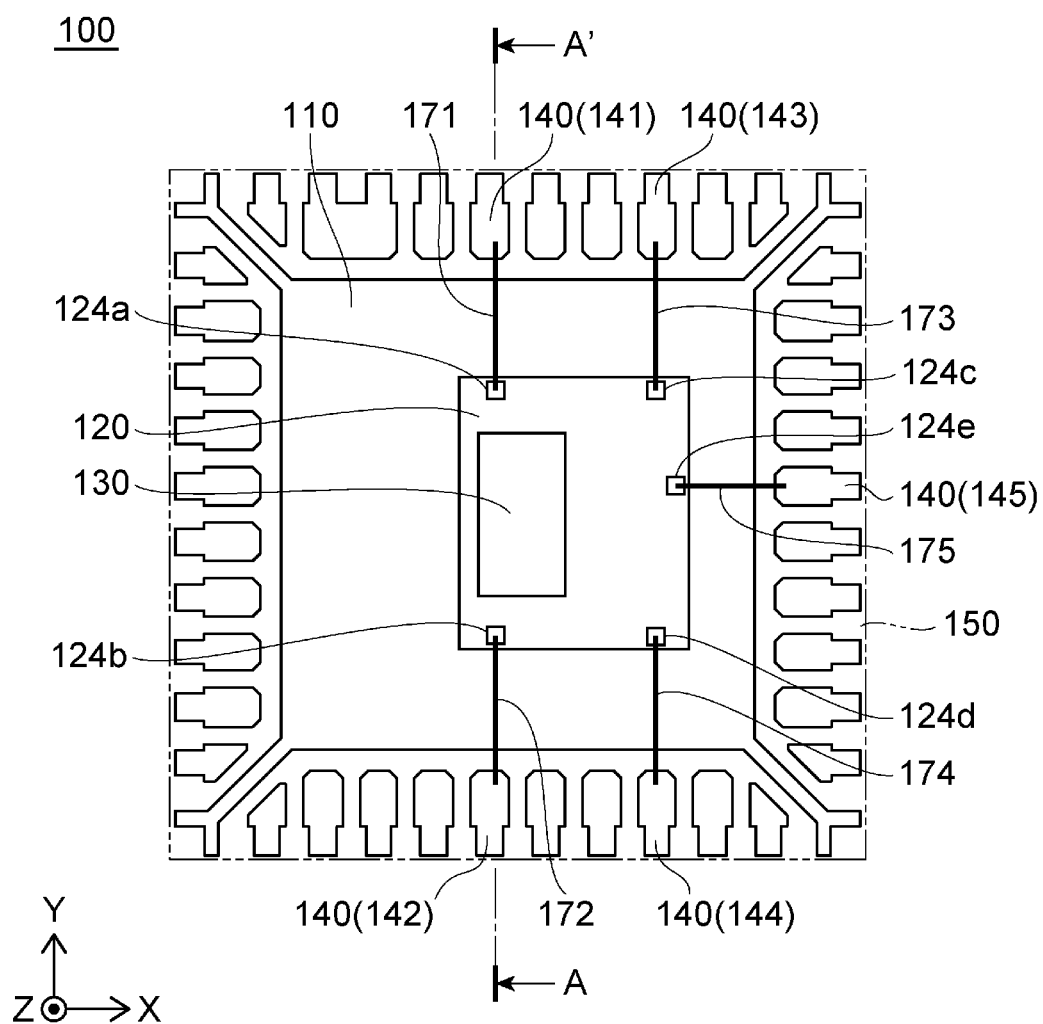
FIG. 1 is a top view illustrating a semiconductor device according to a first embodiment.

FIG. 1 is a top view illustrating a semiconductor device according to the first embodiment.

Figure 2:
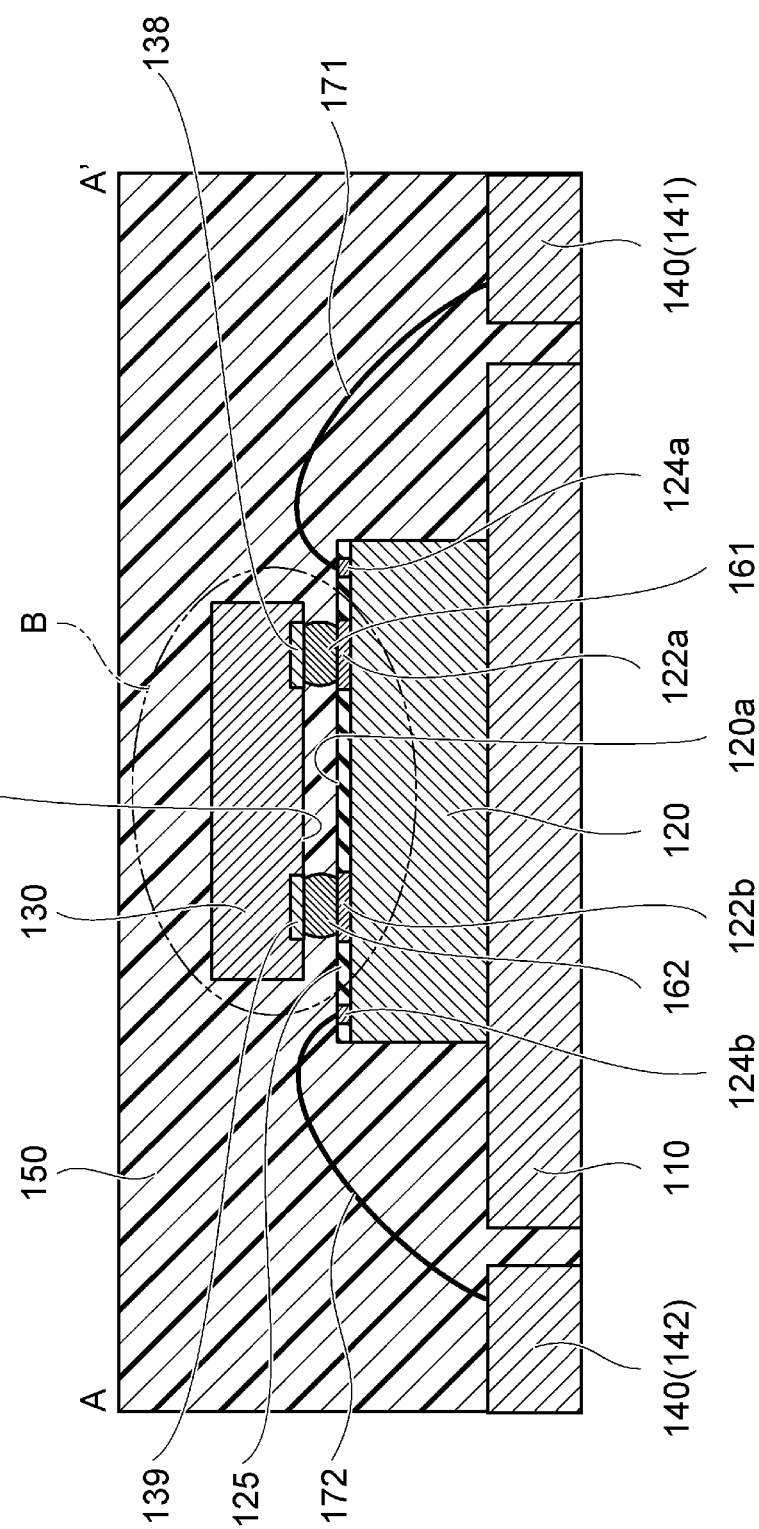
FIG. 2 is a cross-sectional view taken along line A-A' of FIG. 1.

FIG. 2 is a cross-sectional view taken along line A-A' of FIG. 1.

A semiconductor device 100 according to the embodiment will be roughly described with reference to FIGS. 1 and 2. The semiconductor device 100 includes a die pad 110, an integrated circuit (IC) chip 120, a silicon capacitor 130, a plurality of leads 140, and a sealing member 150. In FIG. 1, the sealing member 150 is indicated by a two-dot chain line for easy understanding of an internal structure of the semiconductor device 100.

For easier understanding of the description, an XYZ orthogonal coordinate system is used. A direction from the die pad 110 toward the IC chip will be referred to as "Z direction". One direction perpendicular to the Z direction will be referred to as "X direction". A direction perpendicular to the Z direction and the X direction will be referred to as "Y direction". In addition, one direction along the Z direction may be referred to as "upward direction", and the direction opposite along the Z direction will be referred to as "downward direction". However, the upward direction and the downward direction do not necessarily relate to the gravity direction.

The die pad 110 has a flat shape. The die pad 110 is formed of a metal such as a copper alloy or an iron alloy.

Figure 3:
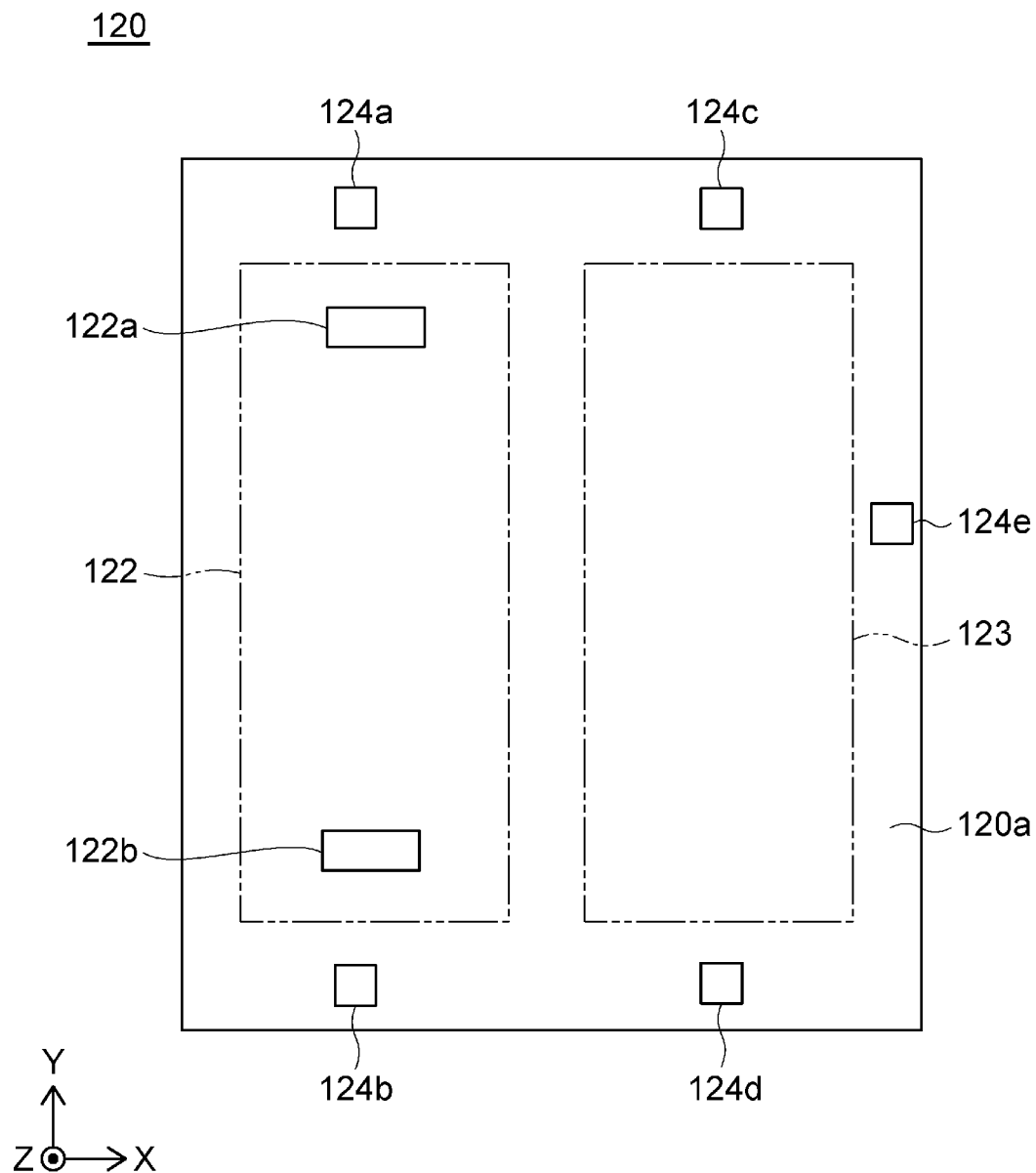
FIG. 3 is a top view illustrating an integrated circuit chip of a semiconductor device according to a first embodiment.

FIG. 3 is a top view illustrating the IC chip of the semiconductor device according to the first embodiment.

Figure 4:
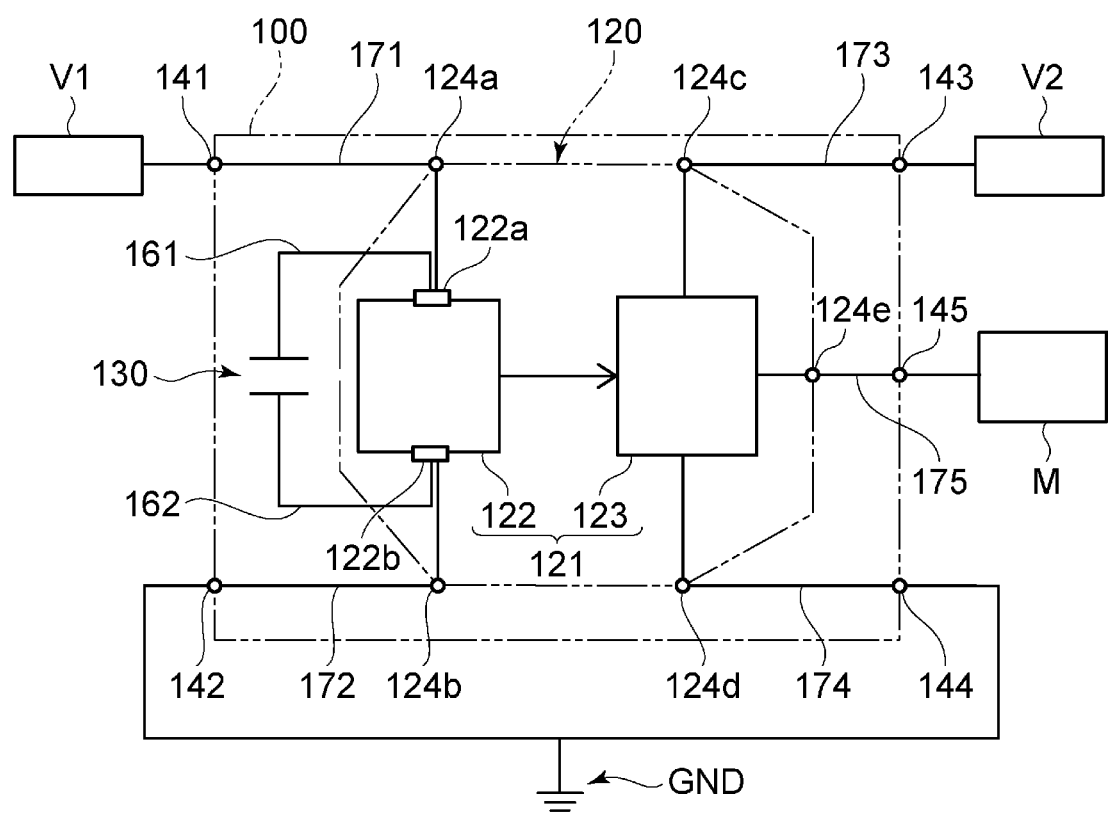
FIG. 4 is a schematic circuit diagram of a semiconductor device according to a first embodiment.

FIG. 4 is a circuit diagram illustrating the semiconductor device according to the first embodiment.

The IC chip 120 is disposed on the die pad 110 and is electrically connected to the die pad 110. The IC chip 120 has a substantially rectangular flat shape. However, the shape of the IC chip is not limited to the above description.

As illustrated in FIG. 4, the IC chip 120 is a driver IC (drive circuit) that controls the driving of a motor M. That is, in this example, the IC chip 120 is a motor control driver (MCD) chip and is mounted on, for example, a vehicle such as an automobile. However, the type of the IC chip 120 is not limited to the above description.

The IC chip 120 includes a control circuit 121 that controls the driving of the motor M. The control circuit 121 includes a logic circuit 122 and a switch circuit 123.

The logic circuit 122 includes a first terminal 122a connected to a first power supply V1 and a second terminal 122b electrically connected to a ground GND. The first terminal 122a and the second terminal 122b are, for example, pad electrodes, as illustrated in FIG. 3, and are provided on an upper surface 120a of the IC chip 120.

Here, "the first terminal 122a and the second terminal 122b are provided on the upper surface 120a of the IC chip 120" indicates that, as illustrated in FIG. 2, at least a part of the first terminal 122a and the second terminal 122b is exposed from other elements configuring the IC chip 120 on the upper surface 120a side of the IC chip 120. Accordingly, the first terminal 122a and the second terminal 122b may be arranged such that upper surfaces thereof are flush with the upper surface 120a of the IC chip 120, or may be arranged to protrude from the upper surface 120a. In the present embodiment, a protective layer 125 is provided on the uppermost layer of the IC chip 120. The upper surfaces of the first terminal 122a and the second terminal 122b are substantially flush with an upper surface of the protective layer 125 and form part of the upper surface 120a of the IC chip 120 together with the upper surface of the protective layer 125. In other examples, the first terminal 122a and the second terminal 122b may be protruded upward from the protective layer 125, or may protrude from the upper surface of the IC chip 120 without the protective layer 125 being provided on the uppermost surface of the IC chip 120.

As illustrated in FIG. 4, the switch circuit 123 switches the motor M ON and OFF according to an output signal of the logic circuit 122.

In addition, as illustrated in FIG. 3, a first pad electrode 124a, a second pad electrode 124b, a third pad electrode 124c, a fourth pad electrode 124d, and a fifth pad electrode 124e are provided on the upper surface 120a of the IC chip 120.

As illustrated in FIG. 4, the first pad electrode 124a is electrically connected to the first terminal 122a in the IC chip 120. The second pad electrode 124b is electrically connected to the second terminal 122b in the IC chip 120. The third pad electrode 124c, the fourth pad electrode 124d, and the fifth pad electrode 124e are electrically connected to the switch circuit 123 in the IC chip 120.

In general, other electrode pads may be further provided on the upper surface of the IC chip 120, but the detailed description and illustration of such other electrode pads will not be made. In addition, the positions and shapes of the first terminal 122a, the second terminal 122b, the first pad electrode 124a, the second pad electrode 124b, the third pad electrode 124c, the fourth pad electrode 124d, and the fifth pad electrode 124e are not particularly limited to the positions and shapes illustrated in FIG. 1.

Figure 5:
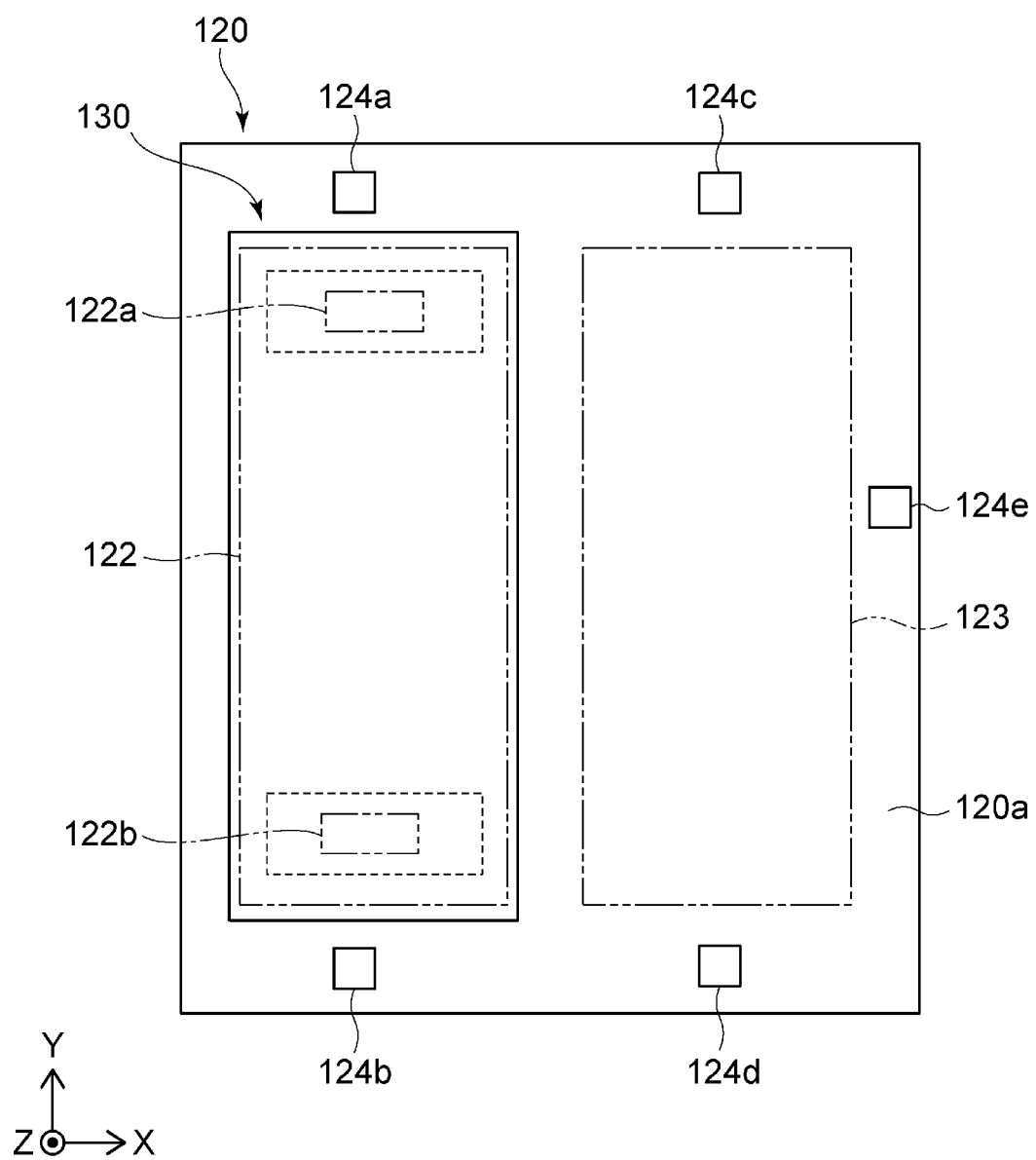
FIG. 5 is a top view illustrating an integrated circuit chip and a silicon capacitor of a semiconductor device according to a first embodiment.

FIG. 5 is a top view illustrating an IC chip and a silicon capacitor of a semiconductor device according to the first embodiment.

Figure 6:
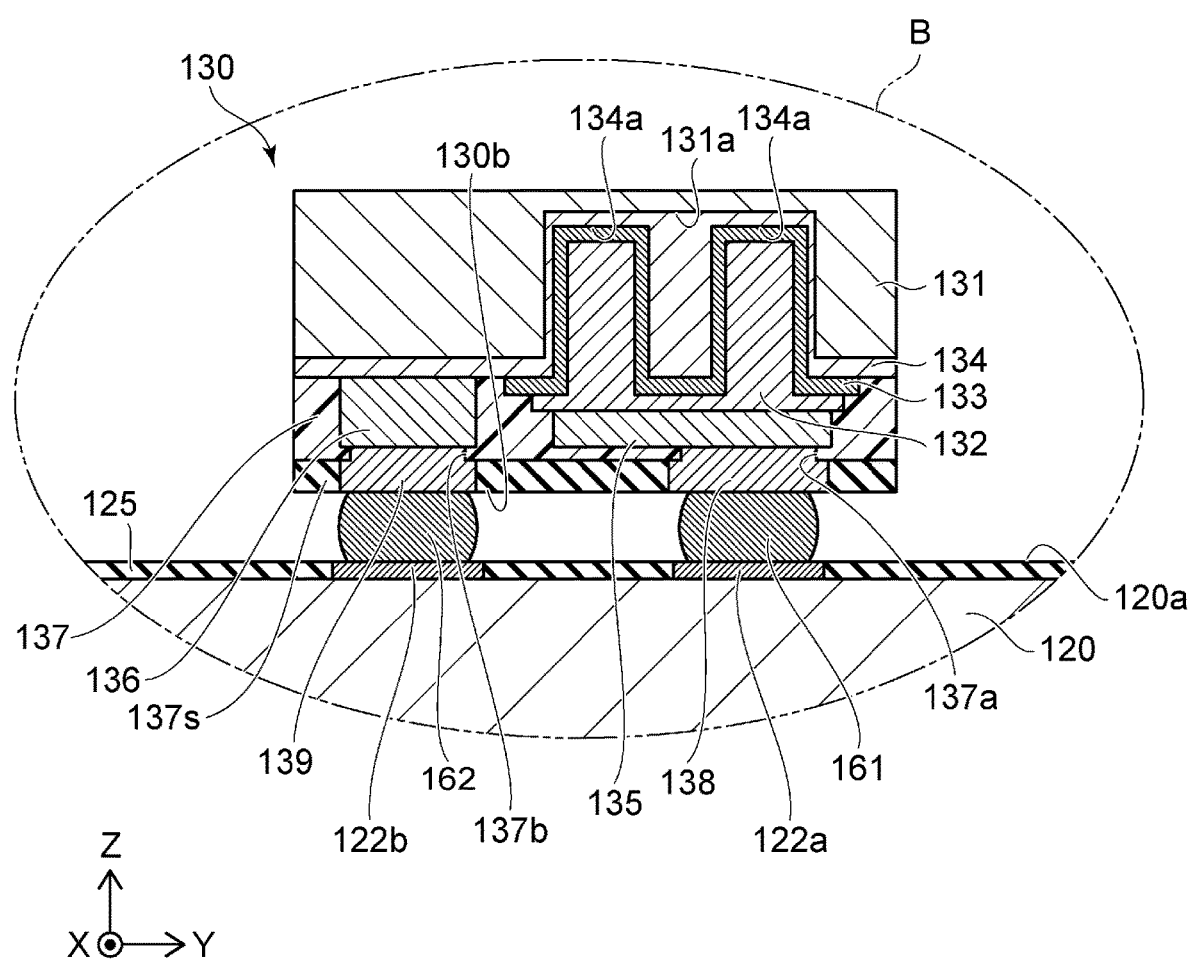
FIG. 6 is an enlarged cross-sectional view illustrating a region of FIG. 2.

FIG. 6 is an enlarged cross-sectional view illustrating a region surrounded by a two-dot chain line B of FIG. 2.

The silicon capacitor 130 faces the upper surface 120a of the IC chip 120. In the first embodiment, the silicon capacitor 130 is disposed directly above the logic circuit 122 of the IC chip 120. The silicon capacitor 130 has a substantially rectangular flat shape in this example. However, the shape of the silicon capacitor 130 is not limited to the above description. The silicon capacitor 130 may also be referred to as a silicon-based capacitor.

As illustrated in FIG. 6, the silicon capacitor 130 includes a substrate 131, a first conductive layer 132, a dielectric layer 133, a second conductive layer 134, a first internal electrode 135, a second internal electrode 136, an insulating layer 137, a protective layer 137s, a first external electrode 138, and a second external electrode 139.

The substrate 131 is formed of, for example, silicon. A trench 131a that is recessed in the upward direction from the lower surface is provided in the substrate 131.

The second conductive layer 134 is provided below the substrate 131. The second conductive layer 134 is formed of, for example, silicon doped with an impurity. In a portion positioned inside the trench 131a on the second conductive layer 134, a plurality of trenches 134a that are recessed in the upward direction from the lower surface are provided.

The dielectric layer 133 is provided below a surrounding region of each of the trenches 134a in the surface of each of the trenches 134a and the lower surface of the second conductive layer 134. The dielectric layer 133 is formed of, for example, a silicon oxide or a silicon nitride. FIG. 6 illustrates the example in which the dielectric layer includes a single layer. However, the dielectric layer may include two or more layers.

The first conductive layer 132 fills a portion below the dielectric layer 133 in each of the trenches 134a. In addition, the first conductive layer 132 is provided below a portion of the dielectric layer 133 protruding from each of the trenches 134a. The first conductive layer 132 is formed of, for example, polysilicon doped with an impurity.

The first internal electrode 135 is disposed directly below the first conductive layer 132 and is connected to the first conductive layer 132. The second internal electrode 136 is formed of, for example, a metal such as copper.

The second internal electrode 136 is disposed directly below the second conductive layer 134 and is connected to the second conductive layer 134. The second internal electrode 136 is disposed only below a region of the substrate 131 where the trench 131a is not provided. The second internal electrode 136 is formed of, for example, the same material as the first internal electrode 135.

The insulating layer 137 covers the first conductive layer 132, the dielectric layer 133, and the second conductive layer 134. In addition, the insulating layer 137 covers a part of the first internal electrode 135 and a part of the second internal electrode 136. The insulating layer 137 is formed of, for example, a silicon oxide or a silicon nitride. The protective layer 137s covers the lower surface of the insulating layer 137.

In the insulating layer 137 and the protective layer 137s, a first opening 137a and a second opening 137b are provided. Another part of the first internal electrode 135 is exposed from the first opening 137a. Another part of the second internal electrode 136 is exposed from the second opening 137b.

The first external electrode 138 is a positive electrode in the first embodiment. The second external electrode 139 is a negative electrode in the first embodiment. The first external electrode 138 and the second external electrode 139 are provided on a lower surface 130b of the silicon capacitor 130.

Here, "the first external electrode 138 and the second external electrode 139 are provided on the lower surface 130b of the silicon capacitor 130" indicates that at least a part of the first external electrode 138 and a part of the second external electrode 139 are exposed from other elements configuring the silicon capacitor 130 on the lower surface 130b side of the silicon capacitor 130. Accordingly, the first external electrode 138 and the second external electrode 139 may be arranged such that lower surfaces thereof are flush with the lower surface 130b of the silicon capacitor 130, or may be arranged to protrude from the lower surface 130b.

In the present embodiment, the protective layer 137s is provided on the lowermost layer of the silicon capacitor 130. The lower surfaces of the first external electrode 138 and the second external electrode 139 are substantially flush with the lower surface of the protective layer 137s, and form parts of the lower surface 130b of the silicon capacitor 130 together with the lower surface of the protective layer 137s. In some cases, the first external electrode 138 and the second external electrode 139 may protrude downward from the protective layer 137s, or may protrude from the lower surface of the silicon capacitor 130 without the protective layer 137s being provided on the lowermost layer of the silicon capacitor 130.

The first external electrode 138 is provided directly below the first internal electrode 135 and directly above the first terminal 122a of the logic circuit 122. The first external electrode 138 is disposed in the first opening 137a. An upper end of the first external electrode 138 is connected to the first internal electrode 135 through the first opening 137a. A lower end of the first external electrode 138 is connected to the first terminal 122a through a first bump 161. The first external electrode 138 is formed of, for example, a metal such as copper. The first bump 161 is formed of, for example, a solder. In the present embodiment, an example in which a "bump" connection is described. In general, any conductive member or component used for connecting or mounting one chip-like element to another chip-like element or a substrate (e.g., a printed circuit board, wiring board, or the like) may be utilized as or in place of first bump 161. First bump 161 may also be referred to a first conductive member 161 and the specific configurations of the first conductive member 161 such as its shape, positioning, and composition are not particularly limited as long as the first external electrode 138 and the first terminal 122a are electrically connected to each other.

The second external electrode 139 is provided directly below the second internal electrode 136 and directly above the second terminal 122b of the logic circuit 122. The second external electrode 139 is disposed in the second opening 137b. An upper end of the second external electrode 139 is connected to the second internal electrode 136 through the second opening 137b. A lower end of the second external electrode 139 is connected to the second terminal 122b through a second bump 162 (also referred to as second conductive member 162). The second external electrode 139 is formed of, for example, the same material as the first external electrode 138. The second bump 162 is formed of, for example, a solder. In the present embodiment, the example in which the second conductive member 162 is a second bump 162 is described. However, specific configurations of the second conductive member 162 such as its shape, positioning, and composition are not particularly limited as long as the second external electrode 139 and the second terminal 122b are electrically connected to each other.

This way, the first external electrode 138 of the silicon capacitor 130 is electrically connected to the first terminal 122a of the logic circuit 122, which is a source of noise generation, and the second external electrode 139 is electrically connected to the second terminal 122b of the logic circuit 122. The silicon capacitor 130 functions to cancel a high frequency noise generated from the logic circuit 122 through repeated charging and discharging. Therefore, the high-frequency noise can be prevented from being transferred from the logic circuit 122 to the first power supply V1 and the ground GND to which the logic circuit 122 is connected. The silicon capacitor may be connected to another circuit in the IC chip other than the logic circuit.

Since the silicon capacitor 130 is closer to the logic circuit 122, which is a source of noise generation, noise is more likely to be reduced by the silicon capacitor 130. In the present embodiment, the first terminal 122a and the second terminal 122b are provided on the upper surface 120a of the IC chip 120. The first external electrode 138 and the second external electrode 139 are provided on the lower surface 130b facing the upper surface 120a in the silicon capacitor 130. The first external electrode 138 is connected to the first terminal 122a through the first bump 161, and the second external electrode 139 is connected to the second terminal 122b through the second bump 162. Therefore, the silicon capacitor 130 can be disposed close to the logic circuit 122.

In addition, the silicon capacitor 130 is a capacitor element in which the substrate 131, the first conductive layer 132, the dielectric layer 133, and the second conductive layer 134 each include silicon. This way, the silicon capacitor 130 includes silicon like the IC chip 120. Therefore, for example, when the IC chip 120 is deformed, the silicon capacitor 130 can easily follow the deformation of the IC chip 120. In addition, the silicon capacitor 130 has excellent adhesion with the sealing member 150. Therefore, by using the silicon capacitor 130 as a capacitor, the reliability of the semiconductor device 100 can be improved.

As illustrated in FIGS. 1 and 2, the leads 140 are provided around the die pad 110. The leads 140 are separated from each other. In addition, the leads 140 are separated from the die pad 110. Each of the leads 140 is formed of the same material as the die pad 110. Hereinafter, five leads among the leads 140 will also be referred to as "first lead 141", "second lead 142", "third lead 143", "fourth lead 144", and "fifth lead 145".

As illustrated in FIG. 1, the first lead 141 is electrically connected to the first pad electrode 124a of the IC chip 120 through a first bonding wire 171. The second lead 142 is electrically connected to the second pad electrode 124b of the IC chip 120 through a second bonding wire 172.

As illustrated in FIG. 4, when the semiconductor device 100 is used, the first lead 141 is electrically connected to, for example, the first power supply V1. When the semiconductor device 100 is used, the second lead 142 is electrically connected to, for example, the ground GND. Therefore, the silicon capacitor 130 can prevent noise from being transferred from the logic circuit 122 to the first power supply V1 or the ground GND.

As illustrated in FIG. 1, the third lead 143 is electrically connected to the third pad electrode 124c of the IC chip 120 through a third bonding wire 173. The fourth lead 144 is electrically connected to the fourth pad electrode 124d of the IC chip 120 through a fourth bonding wire 174. The fifth lead 145 is electrically connected to the fifth pad electrode 124e of the IC chip 120 through a fifth bonding wire 175.

As illustrated in FIG. 4, when the semiconductor device 100 is used, the third lead 143 is electrically connected to, for example, a second power supply V2. When the semiconductor device 100 is used, the fourth lead 144 is connected to, for example, the ground GND. When the semiconductor device 100 is used, the fifth lead 145 is connected to, for example, the motor M.

Specific configurations of each of the various leads such as shape, position, and material are not particularly limited as long as the IC chip 120 can be electrically connected to an external member such as a ground or a power supply to which the semiconductor device 100 is to be connected. In addition, the wiring elements used for electric connection between each of the leads 140 and the IC chip 120 is not limited to bonding wires. In addition, other leads 140 are also connected to the IC chip 120 through bonding wires, but the detailed description and illustration thereof will not be made here.

As illustrated in FIGS. 1 and 2, the sealing member 150 seals the IC chip 120 and the silicon capacitor 130. In addition, the sealing member 150 covers a part of the die pad 110 and a part of each of the leads 140 such that another part of the die pad 110 and another part of each of the leads 140 are left exposed. Specifically, in the present embodiment, the sealing member 150 covers the upper surface of the die pad 110 and the upper surfaces of the leads 140. In addition, the sealing member 150 is provided in a gap between the die pad 110 and the leads 140 and in a gap between leads 140 adjacent to each other. The sealing member 150 is not particularly limited and is formed of, for example, a resin material such as a thermosetting resin. Specific configurations of the sealing member 150 such as the shape and the material are not particularly limited as long as the sealing member 150 seals (encapsulates) the IC chip 120 and the silicon capacitor 130.

Next, the effect of the first embodiment will be described. The leads 140 can be different portions from a lead frame element or the like.

The semiconductor device 100 according to the first embodiment includes the IC chip 120 and the silicon capacitor 130. The IC chip 120 includes the first terminal 122a and the second terminal 122b on the upper surface 120a. The silicon capacitor 130 faces the upper surface 120a of the IC chip 120. The silicon capacitor 130 includes the first external electrode 138 and the second external electrode 139 on the lower surface 130b facing the upper surface 120a, the first external electrode 138 being electrically connected to the first terminal 122a through the first bump 161, and the second external electrode 139 being electrically connected to the second terminal 122b through the second bump 162.

In the semiconductor device 100, the silicon capacitor 130 can prevent noise from being transferred from the IC chip 120 to a member to which the IC chip 120 is connected. In particular, the silicon capacitor 130 faces the upper surface 120a of the IC chip 120 and is electrically connected to the IC chip 120 through the first bump 161 and the second bump 162. Therefore, the silicon capacitor 130 can be disposed close to the IC chip 120. As a result, noise can be efficiently prevented from being transferred from the IC chip 120 to a member to which the IC chip 120 is connected. As described above, the semiconductor device 100 that can reduce noise can be provided.

In addition, in the semiconductor device 100 according to the first embodiment, the silicon capacitor 130 includes silicon in a manner similar to the IC chip 120. Therefore, for example, when the IC chip 120 is deformed, the silicon capacitor 130 can easily follow the deformation of the IC chip 120. Therefore, the reliability of the semiconductor device 100 can be improved.

In addition, the semiconductor device 100 further includes the die pad 110, the first lead 141, the second lead 142, and the sealing member 150. The IC chip 120 is provided on the die pad 110. The first lead 141 is electrically connected to the first terminal 122a. The second lead 142 is electrically connected to the second terminal 122b. The sealing member 150 seals the IC chip 120 and the silicon capacitor 130. In the semiconductor device 100, when the semiconductor device 100 is used, noise can be prevented from being transferred from the IC chip 120 to members to which the first lead 141 and the second lead 142 are connected. In addition, by sealing the IC chip 120 and the silicon capacitor 130 using the sealing member 150, connection of the IC chip 120 and the silicon capacitor 130 can be strengthened. As a result, the reliability of the semiconductor device 100 can be improved.

In addition, the IC chip 120 further includes the logic circuit 122 electrically connected to the first terminal 122a and the second terminal 122b. The silicon capacitor 130 is positioned directly above the logic circuit 122. Therefore, the silicon capacitor 130 can be disposed closer to the logic circuit 122, which is a source of noise generation. As a result, noise can be efficiently prevented from being transferred from the IC chip 120 to a member to which the IC chip is connected.

Second Embodiment

Figure 7:
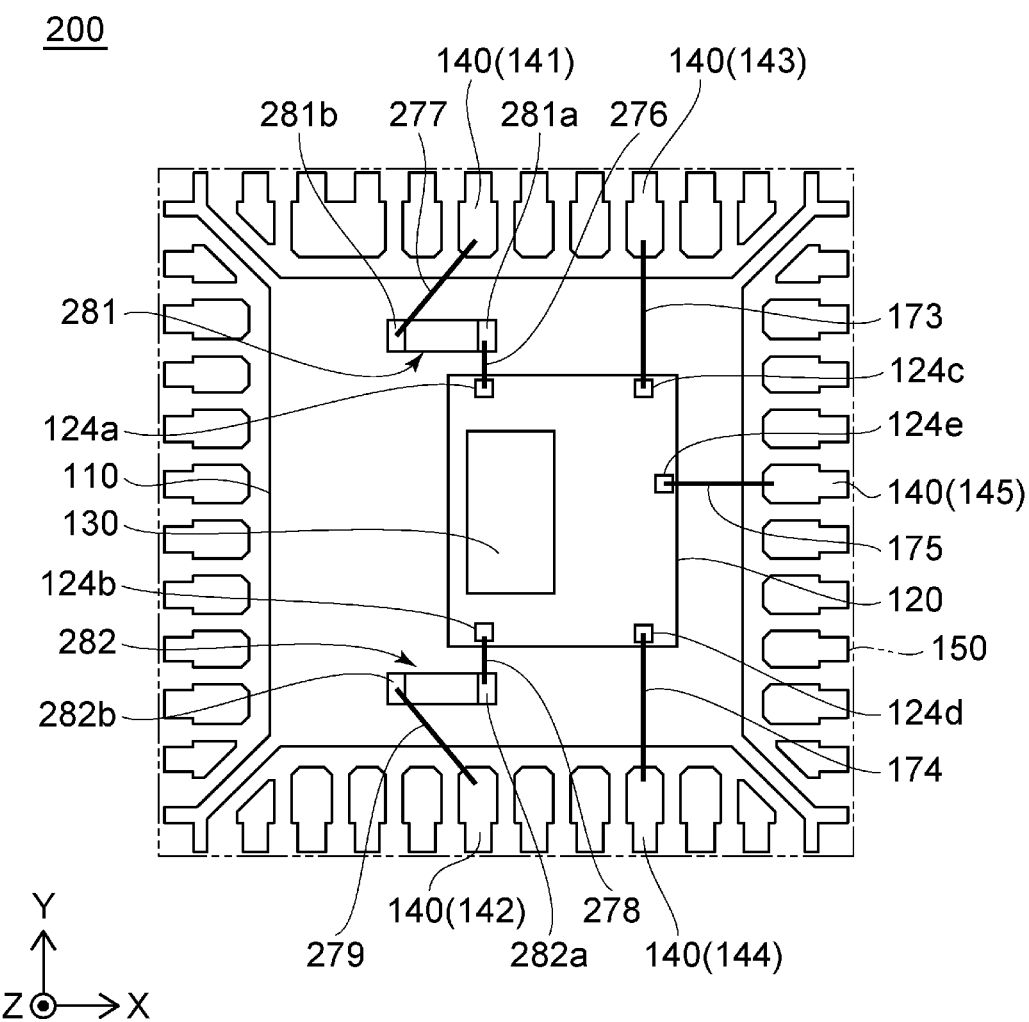
FIG. 7 is a top view illustrating a semiconductor device according to a second embodiment.

FIG. 7 is a top view illustrating a semiconductor device according to a second embodiment.

Figure 8:
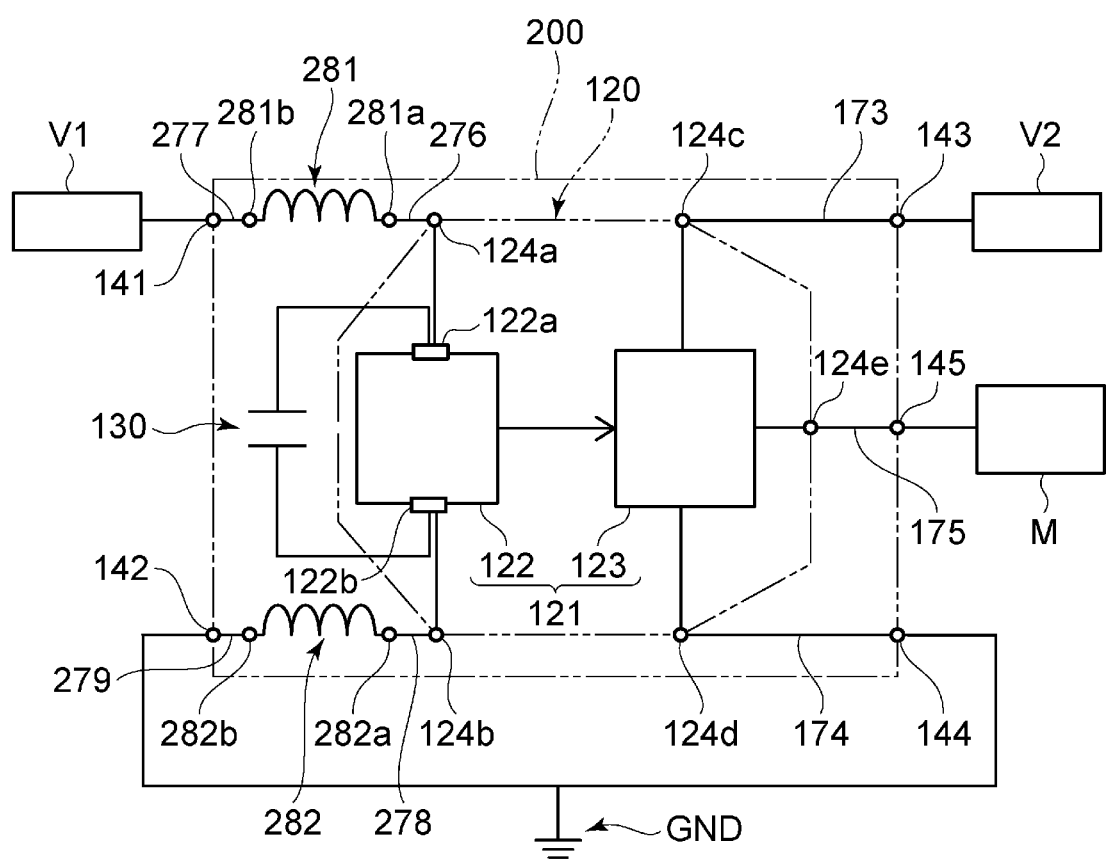
FIG. 8 is a schematic circuit diagram illustrating a semiconductor device according to a second embodiment.

FIG. 8 is a circuit diagram illustrating the semiconductor device according to the second embodiment.

A semiconductor device 200 according to the embodiment is different from the semiconductor device 100 according to the first embodiment in that, for example, it further includes a first inductor 281 and a second inductor 282.

In the following description, primarily the differences from the first embodiment will be described. Features other than those described below can be considered to be the same as the first embodiment.

The first inductor 281 and the second inductor 282 are disposed on the die pad 110. The first inductor 281 and the second inductor 282 are sealed with the sealing member 150.

The first inductor 281 includes a pair of terminals 281a and 281b. The terminal 281a is electrically connected to the first pad electrode 124a through a bonding wire 276. The terminal 281b is electrically connected to the first lead 141 through a bonding wire 277. As illustrated in FIG. 8, the first pad electrode 124a is electrically connected to the first terminal 122a of the logic circuit 122 of the IC chip 120. Accordingly, the first inductor 281 is electrically connected to the first terminal 122a and the first lead 141 of the logic circuit 122.

As illustrated in FIG. 7, the second inductor 282 includes a pair of terminals 282a and 282b. The terminal 282a is electrically connected to the second pad electrode 124b through a bonding wire 278. The terminal 282b is electrically connected to the second lead 142 through a bonding wire 279. As illustrated in FIG. 8, the second pad electrode 124b is electrically connected to the second terminal 122b of the logic circuit 122 of the IC chip 120. Accordingly, the second inductor 282 is electrically connected to the second terminal 122b and the second lead 142 of the logic circuit 122.

In the second embodiment, an example in which bonding wire is used for electrical connections between each of the inductors (281 and 282) and the IC chip 120 is described; however, specific configurations, such as the shape, the position, and the material, of the wiring used for electrical connections between each of the inductors (281 and 282) and the IC chip 120 are not particularly limited as long as each of the inductors (281 and 282) and the IC chip 120 can be electrically connected. Likewise, in the second embodiment, an example in which bonding wire is used for electrical connection between each of the inductors (281 and 282) and each of the leads (141 and 142) is described; however, specific configurations, such as the shape, the position, and the material, of the wiring used for electrical connections between each of the inductors (281 and 282) and each of the leads (141 and 142) are not particularly limited as long as each of the inductors (281 and 282) and each of the leads (141 and 142) can be electrically connected.

As described above, the semiconductor device 200 further includes the first inductor 281 that is electrically connected to the first terminal 122a and the first lead 141 and is sealed with the sealing member 150. Therefore, due to a self induction effect of the first inductor 281, high frequency noise can be prevented from being transferred from the IC chip 120 to the first power supply V1 (or the like) to which the first lead 141 is connected.

In addition, the semiconductor device 200 further includes the second inductor 282 that is electrically connected to the second terminal 122b and the second lead 142 and is sealed with the sealing member 150. Therefore, due to a self induction effect of the second inductor 282, high frequency noise can be prevented from being transferred from the IC chip 120 to the ground GND (or the like) to which the second lead 142 is connected. In addition, noise can be prevented from being transferred to another circuit that shares the ground GND.

In the second embodiment, an example in which the two inductors were provided in the semiconductor device 200 is described. However, the total number of inductors is not limited to the above description.

Third Embodiment

Figure 9:
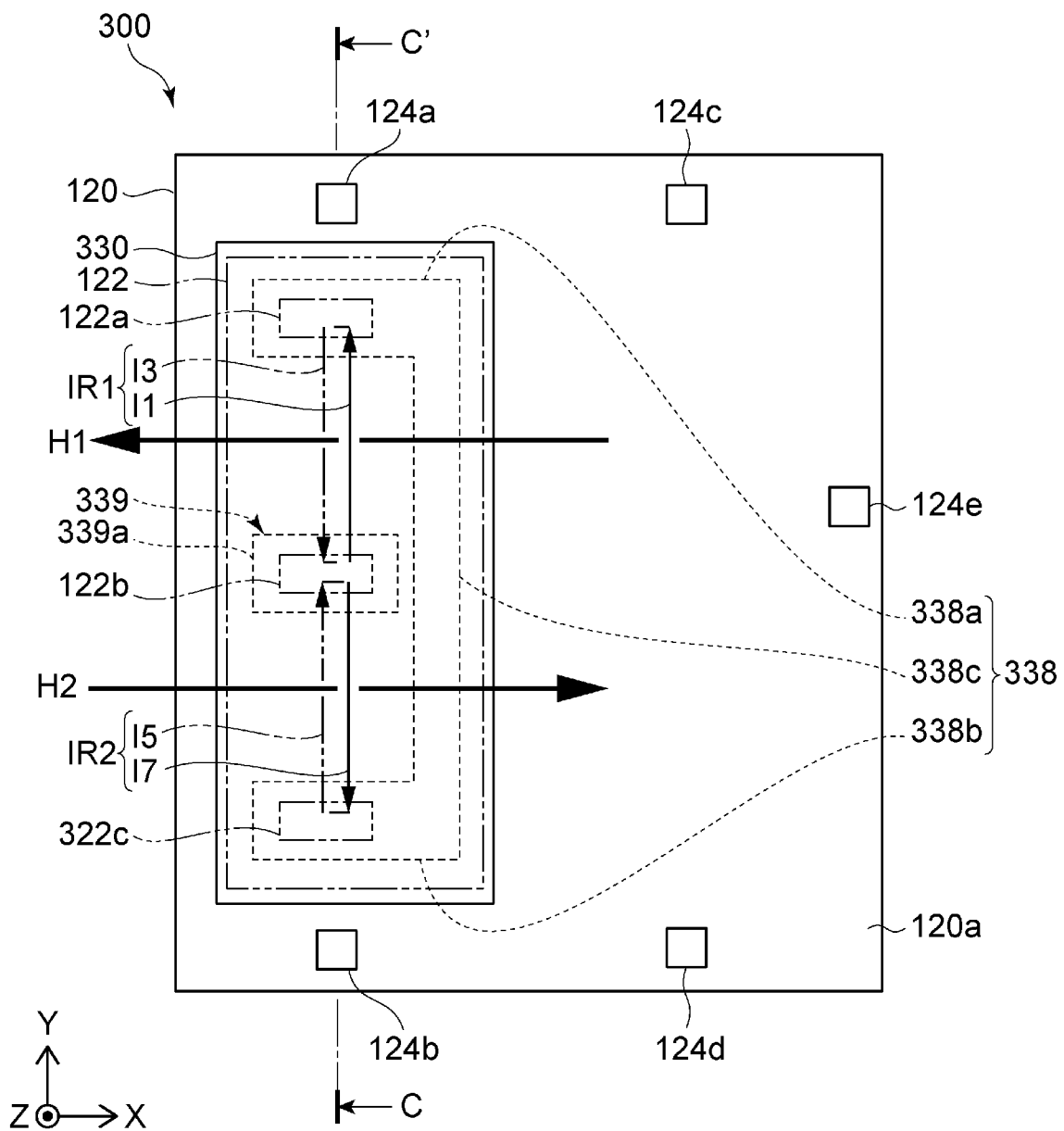
FIG. 9 is a top view illustrating an integrated circuit chip and a silicon capacitor of a semiconductor device according to a third embodiment.

FIG. 9 is a top view illustrating an IC chip and a silicon capacitor of the semiconductor device according to the third embodiment.

Figure 10A:
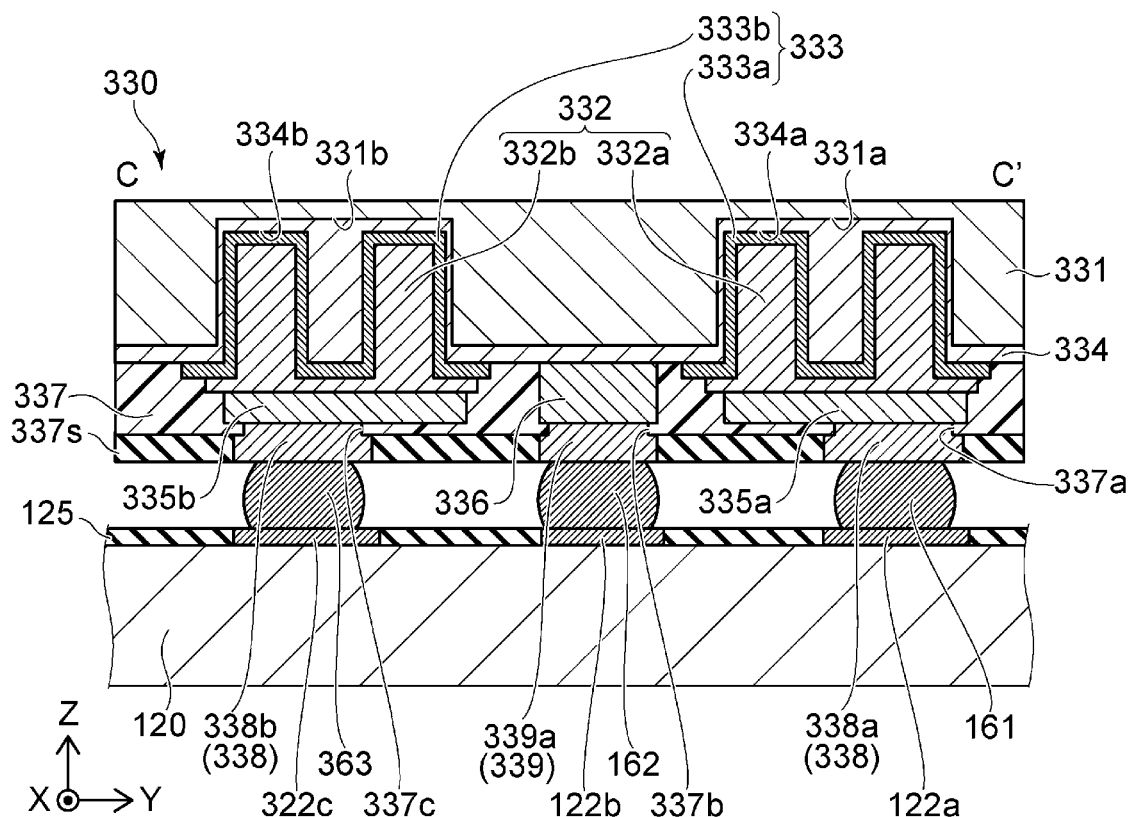
FIG. 10A is a cross-sectional view taken along line C-C' of FIG. 9.
Figure 10B:
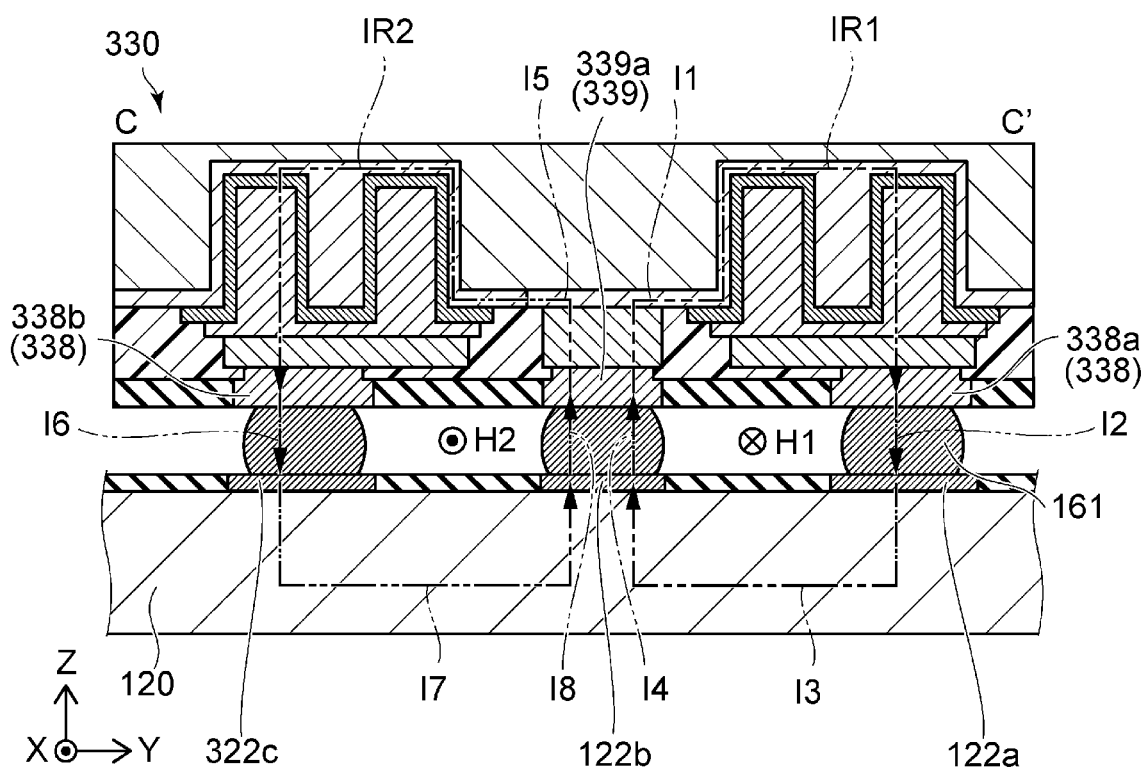
FIG. 10B is a cross-sectional view illustrating aspects related to a current path and a magnetic field direction.

FIG. 10A is a cross-sectional view taken along line C-C' of FIG. 9. FIG. 10B is a cross-sectional view illustrating a current path and a magnetic field direction.

A semiconductor device 300 according to the third embodiment is different from the semiconductor device 100 according to the first embodiment in that a third terminal 322c is further provided in the IC chip 120 and that the structure of a silicon capacitor 330 is different from that of the silicon capacitor 130 according to the first embodiment.

The third terminal 322c is provided on the upper surface 120a of the IC chip 120. The second terminal 122b is positioned between the first terminal 122a and the third terminal 322c. The third terminal 322c is electrically connected to the logic circuit 122 in the IC chip 120.

As illustrated in FIG. 10A, the silicon capacitor 330 includes a substrate 331, a first conductive layer 332, a dielectric layer 333, a second conductive layer 334, two first internal electrodes 335a and 335b, a second internal electrode 336, an insulating layer 337, a protective layer 337s, a first external electrode 338, and a second external electrode 339.

Two trenches 331a and 331b that are recessed in the upward direction from the lower surface are provided on the substrate 331.

The second conductive layer 334 is provided below the substrate 331. In a portion positioned inside the trench 331a on the second conductive layer 334, a plurality of trenches 334a that are recessed in the upward direction from the lower surface are provided. In addition, in a portion positioned inside the trench 331b on the second conductive layer 334, a plurality of trenches 334b that are recessed in the upward direction are provided.

The dielectric layer 333 includes a first portion 333a and a second portion 333b. The first portion 333a is provided below a surrounding region of each of the trenches 334a in the surface of each of the trenches 334a and the lower surface of the second conductive layer 334. The second portion 333b is provided below a surrounding region of each of the trenches 334b in the surface of each of the trenches 334b and the lower surface of the second conductive layer 334.

The first conductive layer 332 includes a first portion 332a and a second portion 332b. The first portion 332a fills a portion below the dielectric layer 333 in each of the trenches 334a. In addition, the first portion 332a is provided below a portion of the dielectric layer 333 protruding from each of the trenches 334a. In addition, the second portion 332b fills a portion below the dielectric layer 333 in each of the trenches 334b. In addition, the second portion 332b is provided below a portion of the dielectric layer 333 protruding from each of the trenches 334b.

The first internal electrode 335a is disposed directly below the first portion 332a of the first conductive layer 332 and is connected to the first portion 332a. The first internal electrode 335b is disposed directly below the second portion 332b of the first conductive layer 332 and is connected to the second portion 332b. The second internal electrode 336 is disposed between the two first internal electrodes 335a and 335b and is connected to the second conductive layer 334.

The insulating layer 337 covers the first conductive layer 332, the dielectric layer 333, and the second conductive layer 334. In addition, the insulating layer 337 covers a part of each of the first internal electrodes 335a and 335b and a part of the second internal electrode 336. The protective layer 337s covers the lower surface of the insulating layer 337.

In the insulating layer 337 and the protective layer 337s, a first opening 337a, a second opening 337b, and a third opening 337c are provided. A part of the first internal electrode 335a is exposed from the first opening 337a. A part of the second internal electrode 336 is exposed from the second opening 337b. A part of the first internal electrode 335b is exposed from the third opening 337c.

The first external electrode 338 is a positive electrode in the third embodiment. As illustrated in FIG. 9, the first external electrode 338 includes a first portion 338a, a second portion 338b, and a connection portion 338c.

As illustrated in FIG. 10A, the first portion 338a is disposed in the first opening 337a. The first portion 338a is provided directly below the first internal electrode 335a and directly above the first terminal 122a of the logic circuit 122 of the IC chip 120. The first portion 338a is connected to the first internal electrode 335a through the first opening 337a. A lower end of the first portion 338a is connected to the first terminal 122a through the first bump 161. As illustrated in FIG. 9, the first portion 338a extends in the X direction.

As illustrated in FIG. 10A, the second portion 338b is disposed in the third opening 337c. The second portion 338b is provided directly below the first internal electrode 335b and directly above the third terminal 322c of the logic circuit 122 of the IC chip 120. The second portion 338b is connected to the first internal electrode 335b through the third opening 337c. A lower end of the second portion 338b is connected to the third terminal 322c through a third bump 363. As illustrated in FIG. 9, the second portion 338b extends in the X direction. In the third embodiment, the example in which a third bump 363 (also referred to as a third conductive member 363) is used for electrical connection between the second portion 338b and the third terminal 322c of the first external electrode 338 is described. However, specific configurations, such as shape and material, of the third conductive member 363 used for electrical connection between the second portion 338b of the first external electrode 335b and the third terminal 322c are not limited to the above description as long as the second portion 338b of the first external electrode 335b and the third terminal 322c can be electrically connected to each other.

The connection portion 338c is connected to the first portion 338a and the second portion 338b. The connection portion 338c extends in the Y direction. In other examples, the connection portion 338c may be omitted.

The second external electrode 339 is a negative electrode in the third embodiment. The second external electrode 339 includes a third portion 339a that is positioned between the first portion 338a and the second portion 338b. The third portion 339a extends in the X direction.

As illustrated in FIG. 10A, the third portion 339a is disposed in the second opening 337b. The third portion 339a is provided directly below the second internal electrode 336 and directly above the second terminal 122b of the logic circuit 122 of the IC chip 120. The third portion 339a is connected to the second internal electrode 336 through the second opening 337b. A lower end of the third portion 339a is connected to the second terminal 122b through the second bump 162. As illustrated in FIG. 9, the third portion 339a extends in the X direction.

The silicon capacitor 330 includes two different pairs of portions one in which the first portion 338a and the third portion 339a are combined and one in which the second portion 338b and the third portion 339a are combined.

As indicated by arrow I1 in FIG. 10B, in the silicon capacitor 330, a current flows from the third portion 339a of the second external electrode 339 toward the first portion 338a of the first external electrode 338. As indicated by arrow I2, a current flows from the first portion 338a of the first external electrode 338 toward the first terminal 122a of the IC chip 120. In the IC chip 120, as indicated by arrow I3, a current flows from the first terminal 122a toward the second terminal 122b. As indicated by arrow I4, a current flows from the second terminal 122b toward the third portion 339a of the second external electrode 339 of the silicon capacitor 330. Accordingly, a current loop IR1 is formed as indicated by the arrows I1, I2, I3, and I4.

Likewise, as indicated by arrow I5, in the silicon capacitor 330, a current flows from the third portion 339a of the second external electrode 339 toward the second portion 338b of the first external electrode 338. As indicated by arrow I6, a current flows from the second portion 338b of the first external electrode 338 toward the third terminal 322c of the IC chip 120. In the IC chip 120, as indicated by arrow I7, a current flows from the third terminal 322c toward the second terminal 122b. As indicated by arrow I8, a current flows from the second terminal 122b toward the third portion 339b of the second external electrode 339 of the silicon capacitor 330. Accordingly, a current loop IR2 is formed as indicated by the arrows I5, I6, I7, and I8.

As described above, as illustrated in FIG. 9, the direction of the current loop IR1 is opposite to the direction of the current loop IR2. In FIG. 9, the current flowing through the silicon capacitor 330 internally is indicated by solid line arrows, and the current flowing through the inside of the IC chip 120 is indicated by two-dot chain line arrows. The same is also applicable to FIGS. 13 and 15 described below. Therefore, a direction of a magnetic field H1 generated by the current loop IR1 is opposite to a direction of a magnetic field H2 generated by the current loop IR2. Therefore, the two magnetic fields H1 and H2 are likely to be canceled out.

In the semiconductor device 300 according to the third embodiment, the third terminal 322c is provided on the upper surface 120a of the IC chip 120. The second terminal 122b is disposed between the first terminal 122a and the third terminal 322c. The first external electrode 338 includes: the first portion 338a electrically connected to the first terminal 122a; and the second portion 338b electrically connected to the third terminal 322c. The second external electrode 339 includes the third portion 339a that is positioned between the first portion 338a and the second portion 338b and is electrically connected to the second terminal 122b. Therefore, the direction of the current loop IR1 flowing through the first portion 338a of the first external electrode 338, the third portion 339a of the second external electrode 339, the second terminal 122b, and the first terminal 122a is opposite to the direction of the current loop IR2 flowing through the second portion 338b of the first external electrode 338, the third portion 339a of the second external electrode 339, the second terminal 122b, and the third terminal 322c. Accordingly, the direction of the magnetic field H1 generated by the current loop IR1 is opposite to the direction of the magnetic field H2 generated by the current loop IR2. As a result, the two magnetic fields H1 and H2 are likely to be canceled out. As a result, an electromagnetic noise radiated from the IC chip 120 can be reduced.

In the third embodiment, a configuration in which the first external electrode 338 is a positive electrode and the second external electrode 339 is a negative electrode is described. However, the first external electrode 338 may be a negative electrode and the second external electrode 339 may be a positive electrode. That is, the negative electrode may include two portions, and at least a part of the positive electrode may be provided between the portions. In addition, in the third embodiment, the example in which the silicon capacitor 330 includes two different pairs of portions including one in which the first portion 338a and the third portion 339a are combined and one in which the second portion 338b and the third portion 339a are combined is described. However, he silicon capacitor 330 may include additional pairs of portions.

Fourth Embodiment

Figure 11:
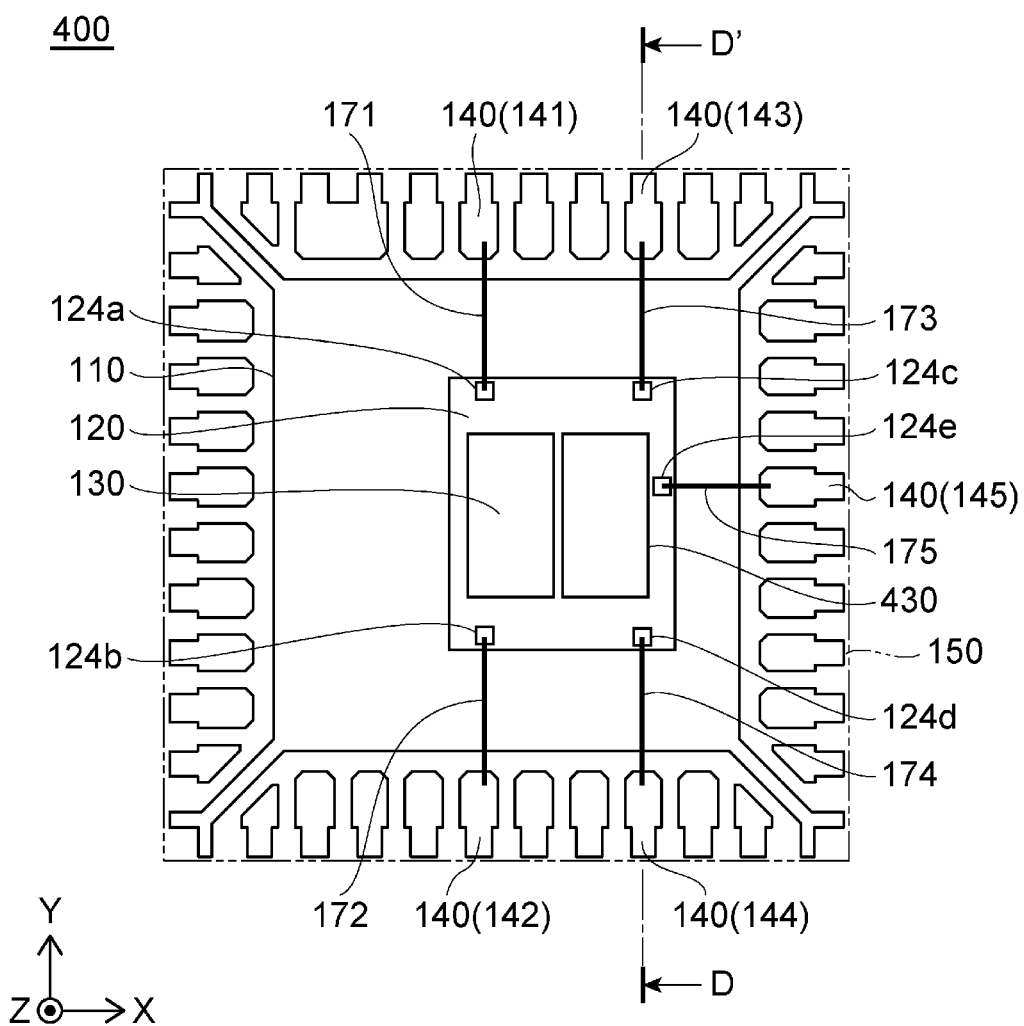
FIG. 11 is a top view illustrating a semiconductor device according to a fourth embodiment.

FIG. 11 is a top view illustrating a semiconductor device according to the fourth embodiment.

Figure 12:
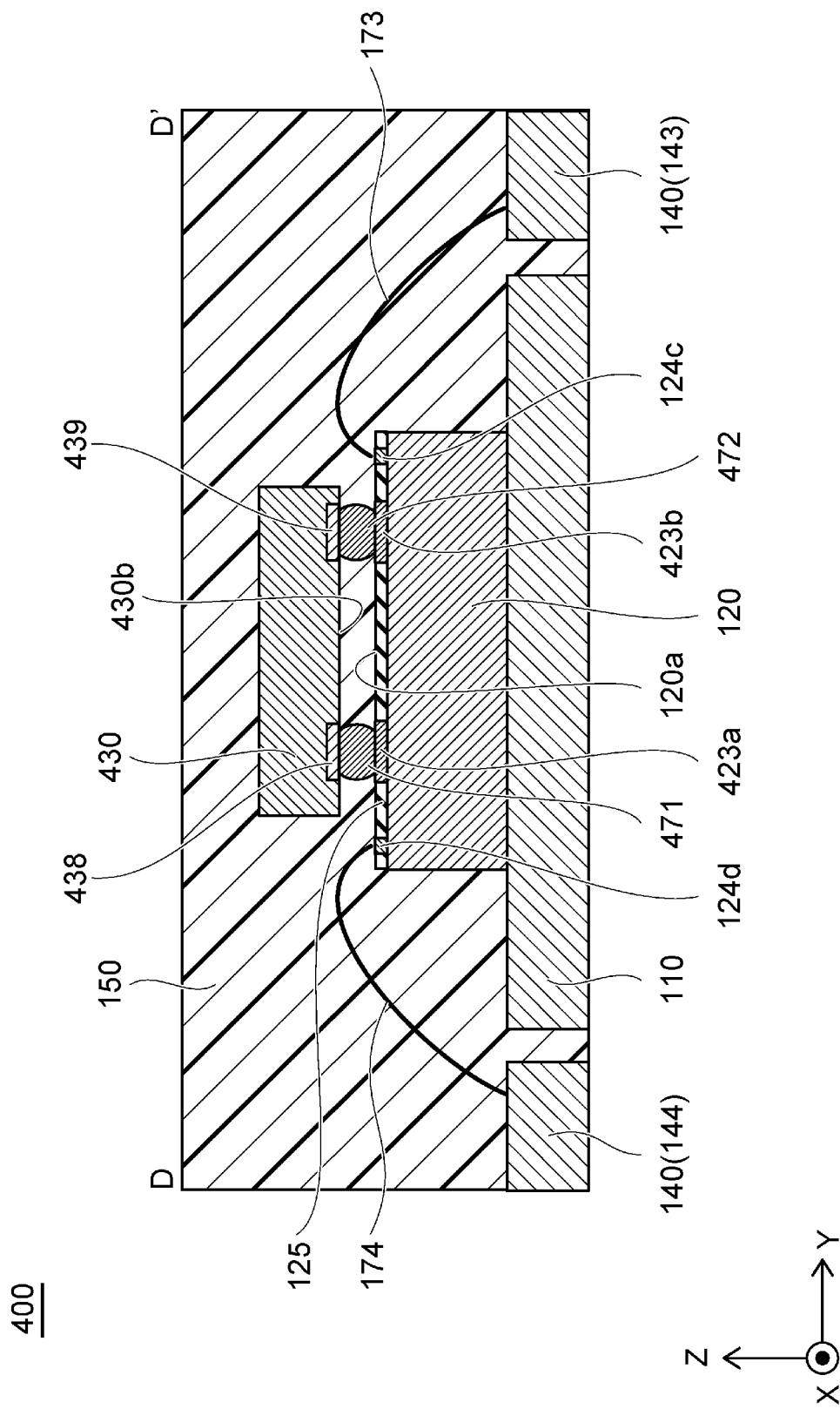
FIG. 12 is a cross-sectional view taken along line D-D' of FIG. 11.

FIG. 12 is a cross-sectional view taken along line D-D' of FIG. 11.

Figure 13:
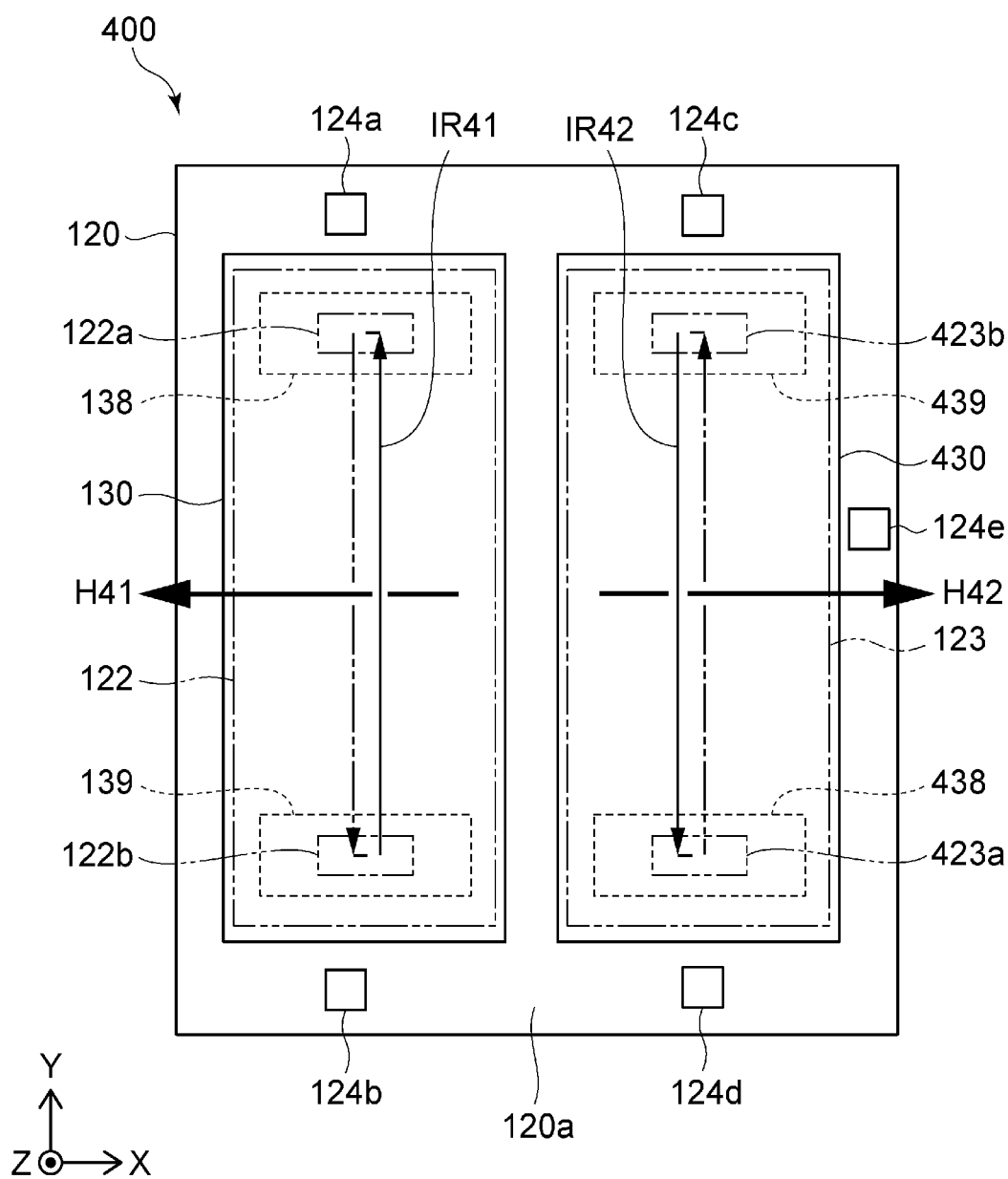
FIG. 13 is a top view illustrating an integrated circuit chip, a first silicon capacitor, and a second silicon capacitor of a semiconductor device according to a fourth embodiment.

FIG. 13 is a top view illustrating an IC chip, a first silicon capacitor, and a second silicon capacitor of the semiconductor device according to the fourth embodiment.

Figure 14:
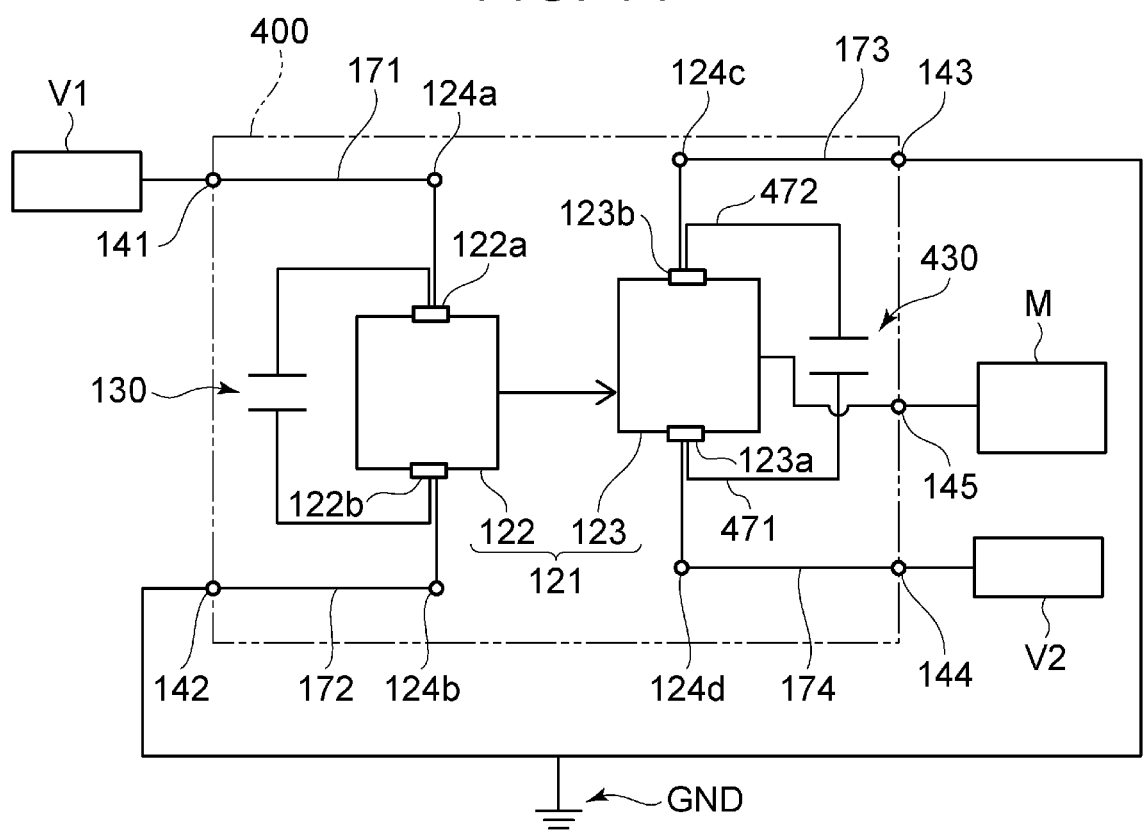
FIG. 14 is a schematic circuit diagram illustrating a semiconductor device according to a fourth embodiment.

FIG. 14 is a circuit diagram illustrating the semiconductor device according to the fourth embodiment.

A semiconductor device 400 according to the fourth embodiment is different from the semiconductor device 100 according to the first embodiment in that a silicon capacitor 430 is provided in addition to the silicon capacitor 130. In the following description, the silicon capacitor 130 will be referred to as "first silicon capacitor 130". In addition, the silicon capacitor 430 will be referred to as "second silicon capacitor 430".

As illustrated in FIGS. 12 and 13, the switch circuit 123 of the IC chip 120 includes a fourth terminal 423a and a fifth terminal 423b. The fourth terminal 423a and the fifth terminal 423b are, for example, pad electrodes, and are provided on the upper surface 120a of the IC chip 120.

As illustrated in FIG. 14, the third pad electrode 124c of the IC chip 120 is electrically connected to the fifth terminal 423b in the IC chip 120. The fourth pad electrode 124d is electrically connected to the fourth terminal 423a in the IC chip 120.

As illustrated in FIG. 13, the second silicon capacitor 430 is provided directly above the switch circuit 123 on the upper surface 120a of the IC chip 120.

A basic structure of the second silicon capacitor 430 is substantially the same as the first silicon capacitor 130, and thus the detailed description will not be made. A member of the second silicon capacitor 430 corresponding to the first external electrode 138 of the first silicon capacitor 130 will be referred to as "third external electrode 438". In addition, a member of the second silicon capacitor 430 corresponding to the second external electrode 139 of the first silicon capacitor 130 will be referred to as "fourth external electrode 439". In the fourth embodiment, the third external electrode 438 is a positive electrode, and the fourth external electrode 439 is a negative electrode. Similar to the first silicon capacitor 130, as illustrated in FIG. 12, the third external electrode 438 and the fourth external electrode 439 are provided on a lower surface 430b of the second silicon capacitor 430.

The third external electrode 438 is disposed directly above the fourth terminal 423a and is electrically connected to the fourth terminal 423a through a fourth bump 471. The fourth external electrode 439 is disposed directly above the fifth terminal 423b and is electrically connected to the fifth terminal 423b through a fifth bump 472. In the fourth embodiment, an example in which the fourth bump 471 is a fourth conductive member is described. Specific configurations of the fourth conductive member such as the shape and the material are not particularly limited as long as the third external electrode of the second silicon capacitor and the fourth terminal of the IC chip can be electrically connected to each other. In addition, in the fourth embodiment, an example in which the fifth bump 472 is a fifth conductive member is described. Specific configurations of the fifth conductive member such as the shape and the material are not particularly limited as long as the fourth external electrode of the second silicon capacitor and the fifth terminal of the IC chip can be electrically connected to each other.

As illustrated in FIG. 14, in the fourth embodiment, the third lead 143 (electrically connected to the third pad electrode 124c) is connected to the ground GND when the semiconductor device 100 is in use. In addition, the fourth lead 144 (electrically connected to the fourth pad electrode 124d) is connected to the second power supply V2 when the semiconductor device 100 is in use. Therefore, the second silicon capacitor 430 can prevent a high frequency noise from being transferred from the switch circuit 123 to the second power supply V2 or the ground GND to which the switch circuit 123 is connected.

In addition, in the fourth embodiment, as illustrated in FIG. 13, a direction from the first external electrode 138 toward the second external electrode 139 is opposite to a direction from the third external electrode 438 toward the fourth external electrode 439. Therefore, a direction of a current loop IR41 flowing through the logic circuit 122 and the first silicon capacitor 130 is opposite to a direction of a current loop IR42 flowing through the switch circuit 123 and the second silicon capacitor 430. Therefore, a direction of a magnetic field H41 generated by the current loop IR41 is opposite to a direction of a magnetic field H42 generated by the current loop IR42. As a result, the two magnetic fields H41 and H42 are likely to be canceled out by one another. Therefore, an electromagnetic noise radiated from the IC chip 120 can be reduced.

As described above, in the semiconductor device 400 according to the fourth embodiment, the IC chip 120 further includes the fourth terminal 423a and the fifth terminal 423b on the upper surface 120a. The semiconductor device 400 further includes the second silicon capacitor 430. The second silicon capacitor 430 faces the upper surface 120a. The second silicon capacitor 430 includes the third external electrode 438 and the fourth external electrode 439 on the lower surface 430b facing the upper surface 120a, the third external electrode 438 being electrically connected to the fourth terminal 423a through the fourth bump 471, and the fourth external electrode 439 being electrically connected to the fifth terminal 423b through the fifth bump 472. Therefore, the second silicon capacitor 430 can prevent noise from being transferred from the IC chip 120 to a member to which the IC chip 120 is connected.

In addition, the IC chip 120 further includes the switch circuit 123 electrically connected to the fourth terminal 423a and the fifth terminal 423b. The second silicon capacitor 430 is positioned directly above the switch circuit 123. Therefore, the second silicon capacitor 430 can be disposed close to the switch circuit 123, which is a source of noise generation. As a result, noise can be efficiently prevented from being transferred from the IC chip 120 to a member to which the IC chip is connected.

In addition, the first external electrode 138 and the third external electrode 438 are a positive electrode, and the second external electrode 139 and the fourth external electrode 439 are a negative electrode. The direction from the first external electrode 138 toward the second external electrode 139 is opposite to the direction from the third external electrode 438 toward the fourth external electrode 439. Therefore, the direction of the current loop IR41 flowing through the first silicon capacitor 130 and the logic circuit 122 is opposite to the direction of the current loop IR41 flowing through the second silicon capacitor 430 and the logic circuit 122. Accordingly, the direction of the magnetic field H41 generated by the current loop IR41 is opposite to the direction of the magnetic field H42 generated by the current loop IR42. As a result, the two magnetic fields H41 and H42 are likely to be canceled out by one another. As a result, an electromagnetic noise radiated from the IC chip 120 can be reduced.

Figure 15:
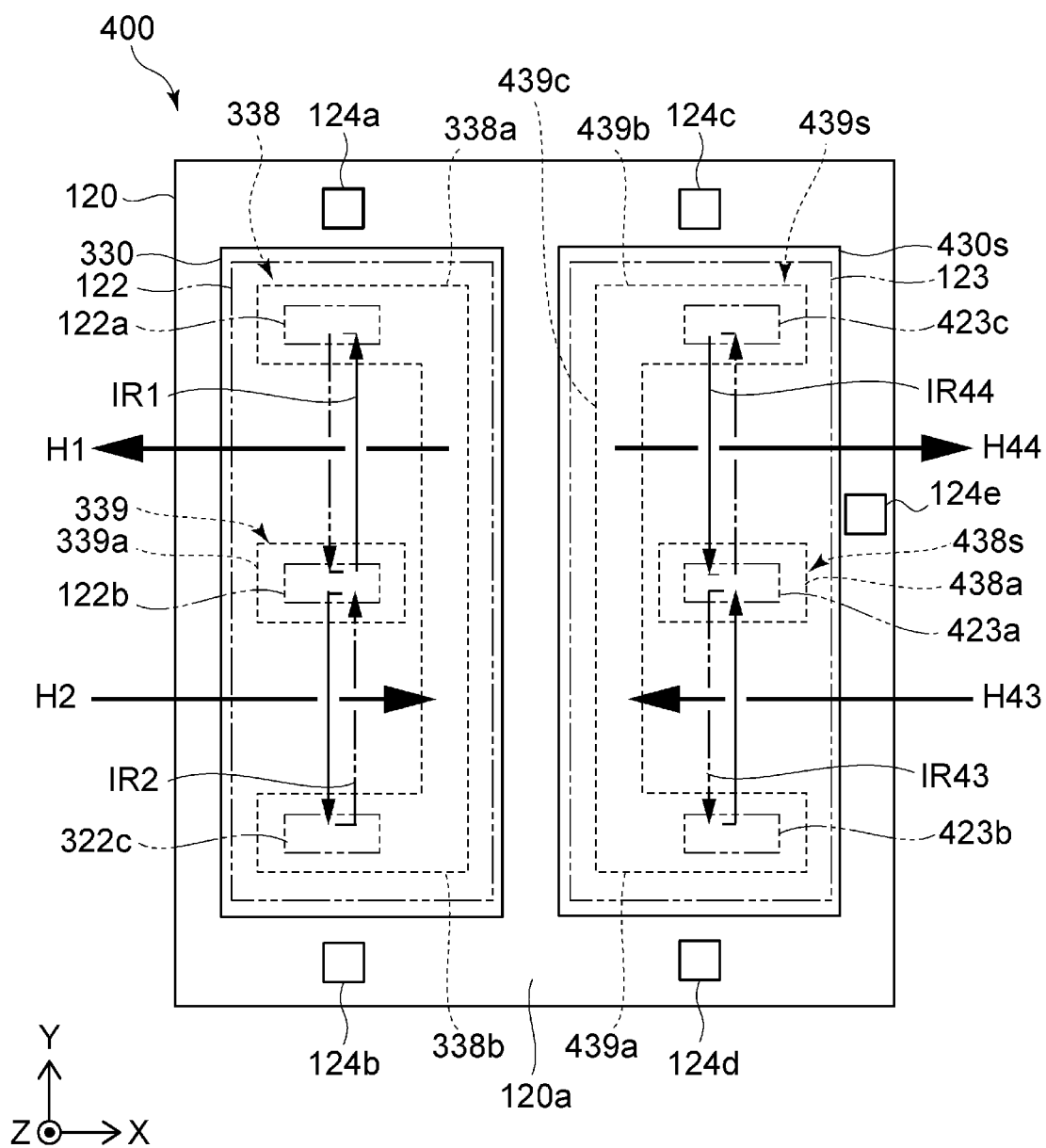
FIG. 15 is a top view illustrating a modification example of a first silicon capacitor and a second silicon capacitor of a semiconductor device according to a fourth embodiment.

FIG. 15 is a top view illustrating a modification example of the IC chip, the first silicon capacitor, and the second silicon capacitor of the semiconductor device according to the fourth embodiment.

As in the third embodiment, the third terminal 322c (electrically connected to the logic circuit 122) may be provided on the upper surface 120a of the IC chip 120. In addition, a sixth terminal 423c (electrically connected to the switch circuit 123) may be further provided on the upper surface 120a of the IC chip 120. The fourth terminal 423a is positioned between the fifth terminal 423b and the sixth terminal 423c.

The first silicon capacitor 330, having the same configuration as the silicon capacitor 330 according to the third embodiment, may be provided on the logic circuit 122. As a result, as in the third embodiment, the current loops IR1 and IR2 flowing in opposite directions are generated. In addition, the magnetic fields H1 and H2 having opposite directions are generated by the two current loops IR1 and IR2.

In addition, a second silicon capacitor 430s may be provided on the switch circuit 123. In the second silicon capacitor 430s, structures of a positive electrode and a negative electrode are opposite to those of the first silicon capacitor 330, a fourth external electrode 439s corresponding to the negative electrode includes a first portion 439a and a second portion 439b, a third external electrode 438s corresponding to the positive electrode includes a third portion 438a disposed between the first portion 439a and the second portion 439b, and the first portion 439a and the second portion 439b in the fourth external electrode 439s are connected to each other through a connection portion 439c.

The third portion 438a of the third external electrode 438s is electrically connected to the fourth terminal 423a. The first portion 439a of the fourth external electrode 439s is electrically connected to the fifth terminal 423b. The second portion 439b of the fourth external electrode 439s is electrically connected to the sixth terminal 423c.

As a result, a current loop IR43 flowing through the third portion 438a of the third external electrode 438s, the first portion 439a of the fourth external electrode 439s, the fifth terminal 423b, and the fourth terminal 423a is generated. In addition, a current loop IR44 flowing through the third portion 438a of the third external electrode 438s, the second portion 439b of the fourth external electrode 439s, the sixth terminal 423c, and the fourth terminal 423a is generated. In addition, magnetic fields H43 and H44 having opposite directions are generated by the two current loops IR43 and IR44.

The two magnetic fields H1 and H2 have opposite directions and thus are likely to be canceled out. In addition, the two magnetic fields H43 and H44 have opposite directions and thus are likely to be canceled out. The two magnetic fields H1 and H44 also have opposite directions and thus are likely to be canceled out. The two magnetic fields H2 and H43 also have opposite directions and thus are likely to be canceled out. Therefore, an electromagnetic noise radiated from the IC chip 120 can be reduced.

Fifth Embodiment

Figure 16:
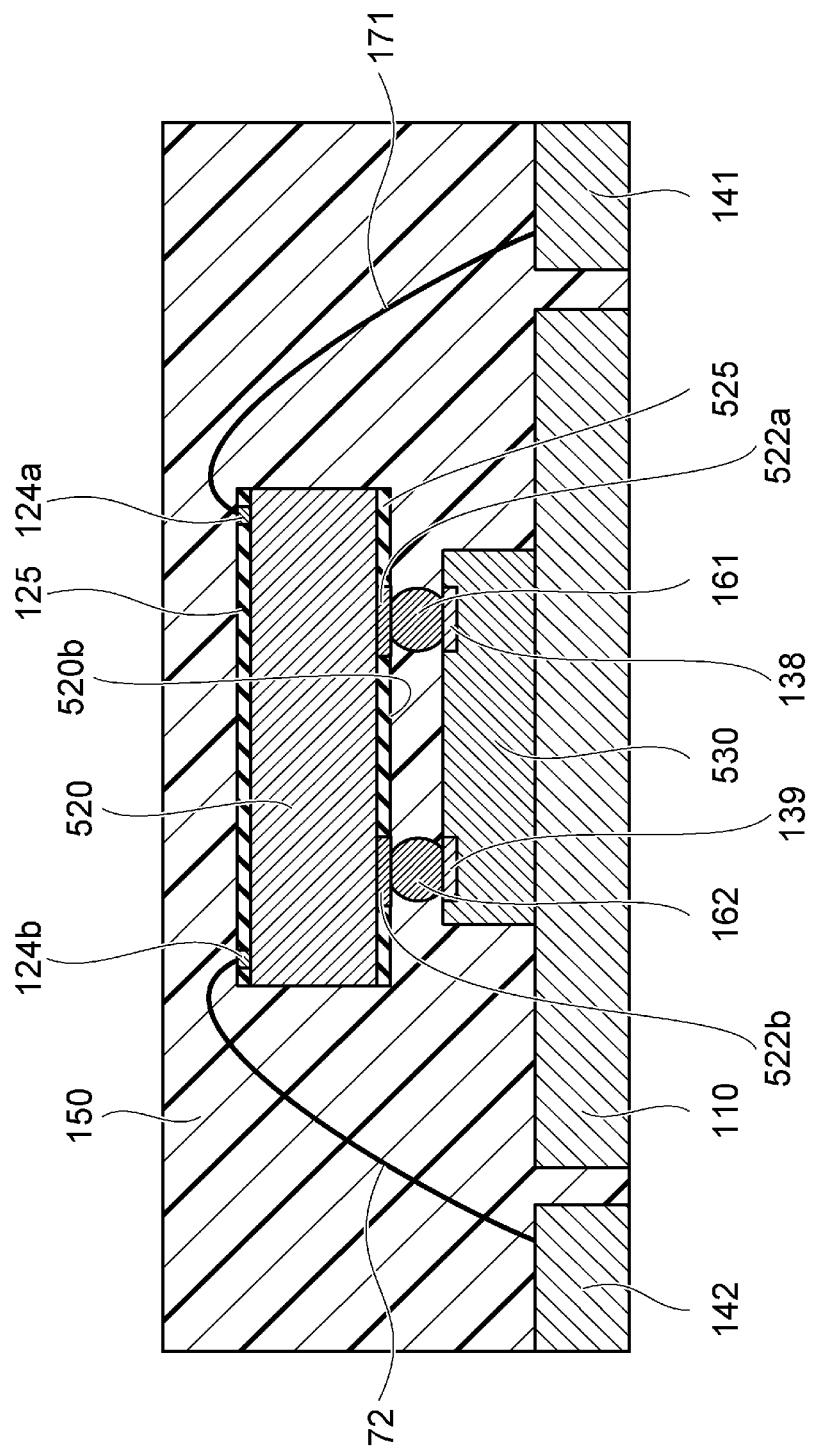
FIG. 16 is a cross-sectional view illustrating a semiconductor device according to a fifth embodiment.

FIG. 16 is a cross-sectional view illustrating a semiconductor device according to the fifth embodiment.

A semiconductor device 500 according to the fifth embodiment is different from the semiconductor device 100 according to the first embodiment in that, for example, a silicon capacitor 530 is provided between the die pad 110 and an IC chip 520.

In the IC chip 520, a first terminal 522a and a second terminal 522b of the logic circuit 122 are provided on a lower surface 520b. In FIG. 16, a protective film 525 is provided on the lowermost layer of the IC chip 520, and lower surfaces of the first terminal 522a and the second terminal 522b are substantially flush with a lower surface of the protective film 525. In this case, the first terminal and the second terminal may protrude downward from the lower surface of the protective film, or may protrude downward from the lower surface of the IC chip without the protective film being provided on the lowermost layer of the IC chip.

The silicon capacitor 530 has a similar configuration as the silicon capacitor 130 according to the first embodiment, except that the first external electrode 138 and the second external electrode 139 are arranged to face upward. The first external electrode 138 of the silicon capacitor 530 is connected to the first terminal 522a provided on the lower surface 520b of the IC chip through the first bump 161. The second external electrode 139 of the silicon capacitor 530 is connected to the second terminal 522b provided on the lower surface 520b of the IC chip through the second bump 162.

As described above, in the semiconductor device 500, the silicon capacitor 530 is disposed between the die pad 110 and the IC chip 520. Even in this configuration, when the semiconductor device 500 is used, the silicon capacitor 530 can prevent noise from being transferred from the IC chip 520 to a member to which the IC chip 520 is connected. In this case, the IC chip 520 can be electrically connected to the die pad 110 through a wiring member such as a bonding wire. In addition, an insulating member may be provided between the silicon capacitor 530 and the die pad 110.

Sixth Embodiment

Figure 17:
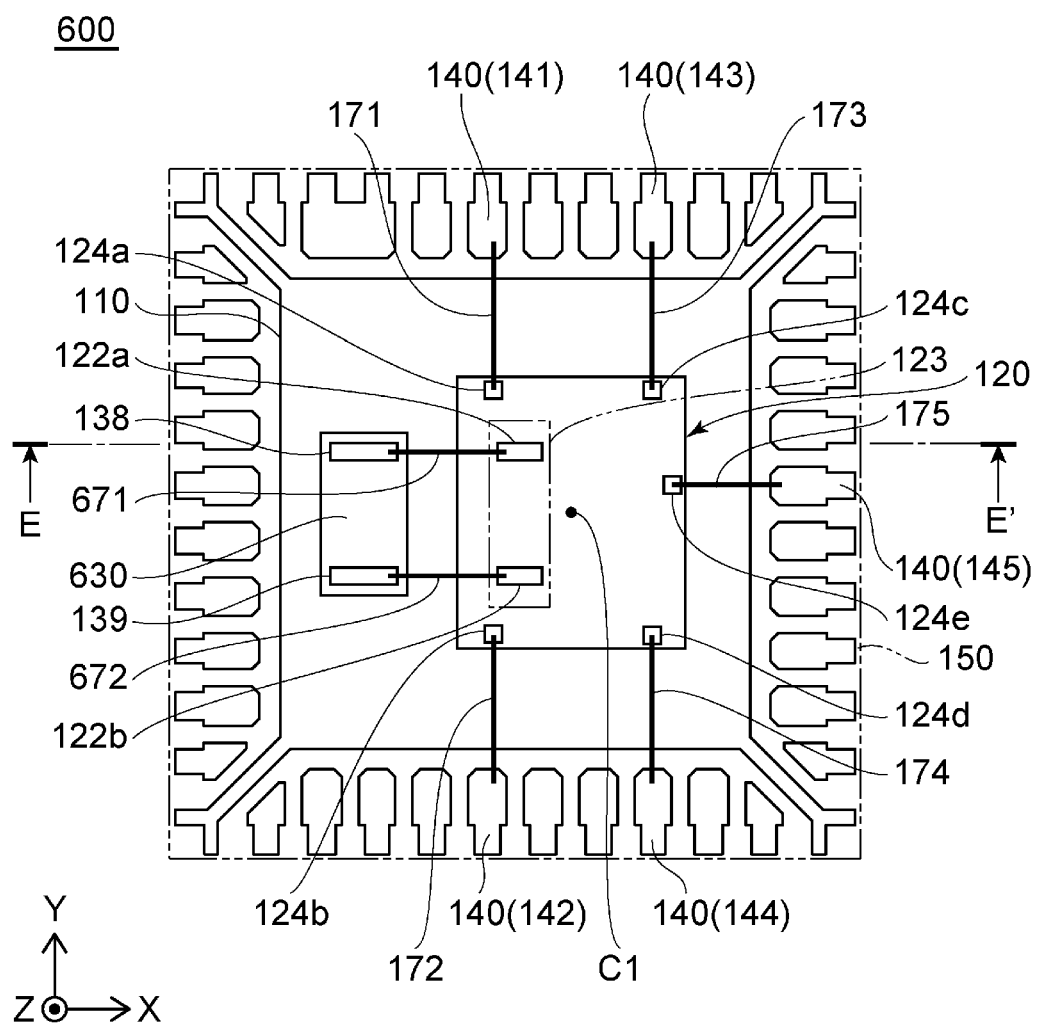
FIG. 17 is a top view illustrating a semiconductor device according to a sixth embodiment.

FIG. 17 is a top view illustrating a semiconductor device according to the sixth embodiment.

Figure 18:
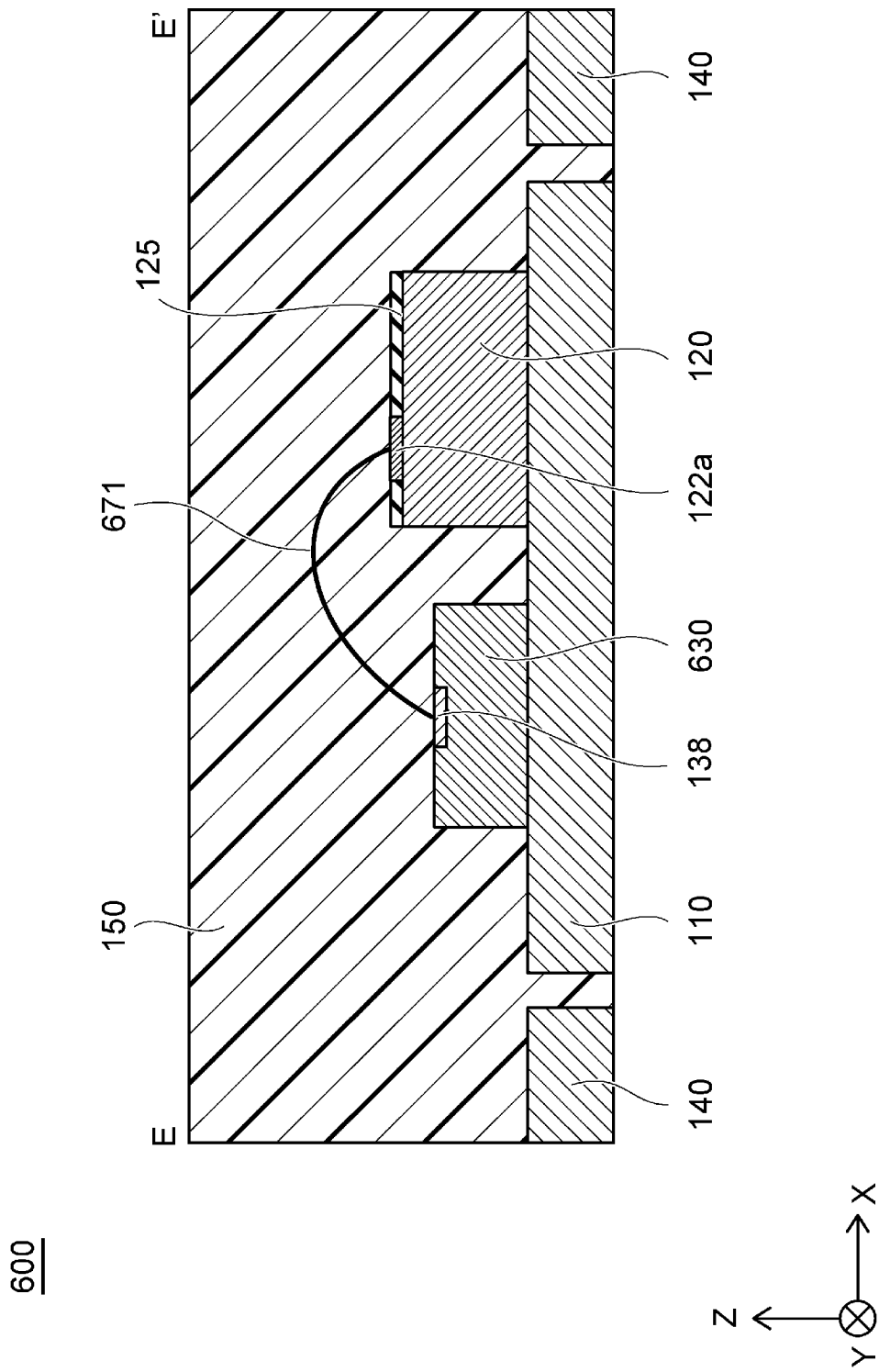
FIG. 18 is a cross-sectional view taken along line E-E' of FIG. 17.

FIG. 18 is a cross-sectional view taken along line E-E' of FIG. 17.

A semiconductor device 600 according to the sixth embodiment is different from the semiconductor device 100 according to the first embodiment in that, for example, a silicon capacitor 630 is provided on the die pad 110.

As illustrated in FIG. 17, the logic circuit 122 is positioned between a center C1 of the IC chip 120 and the silicon capacitor 630 in a top view. Here, the center C1 of the IC chip 120 is positioned at an intersection with a diagonal line of the IC chip 120.

As illustrated in FIGS. 17 and 18, the silicon capacitor 630 has a similar configuration as the silicon capacitor 130 according to the first embodiment, except that the first external electrode 138 and the second external electrode 139 are arranged to face upward and to be adjacent to the IC chip 120 on the die pad 110. The sealing member 150 seals the silicon capacitor 630.

The first external electrode 138 of the silicon capacitor 630 is electrically connected to the first terminal 122a through a first bonding wire 671. As illustrated in FIG. 17, the second external electrode 139 of the silicon capacitor 630 is electrically connected to the second terminal 122b through a second bonding wire 672. In the sixth embodiment, the example in which the first wiring member and the second wiring member are bonding wires is described. However, specific configurations of the first wiring member and the second wiring member such as the shape, the position, and the material are not particularly limited as long as the silicon capacitor and the IC chip can be electrically connected to each other.

The semiconductor device 600 according to the sixth embodiment includes the die pad 110, the IC chip 120, the silicon capacitor 630, the first lead 141, the second lead 142, and the sealing member 150. The IC chip 120 is provided on the die pad 110 and includes the first terminal 122a and the second terminal 122b. The silicon capacitor 630 includes a first external electrode 638 and a second external electrode 639, the first external electrode 638 being electrically connected to the first terminal 122a through the first bonding wire 671, and the second external electrode 639 being electrically connected to the second terminal 122b through the second bonding wire 672. The first lead 141 is electrically connected to the first terminal 122a. The second lead 142 is electrically connected to the second terminal 122b. The sealing member 150 seals the IC chip 120 and the silicon capacitor 630.

In this way, the silicon capacitor 630 may be provided on the die pad 110 and may be electrically connected to the IC chip 120 through the bonding wires 671 and 672. Even in this configuration, when the semiconductor device 600 is used, the silicon capacitor 630 can prevent noise from being transferred from the IC chip 120 to a member to which the IC chip 120 is connected.

In particular, the IC chip 120 and the silicon capacitor 630 are disposed on the die pad 110, and the silicon capacitor 630 is connected to the IC chip 120 through the bonding wires 671 and 672. Therefore, as compared to the configuration in which the IC chip and the silicon capacitor are disposed on the substrate and are electrically connected to each other through a wiring of the substrate, in the semiconductor device 600, it is not necessary to provide a wiring on the substrate. Therefore, the semiconductor device 600 can be manufactured more easily.

The first bonding wire 671 may be connected to the first pad electrode 124a instead of being directly connected to the first terminal 122a. Likewise, the second bonding wire 672 may be connected to the second pad electrode 124b instead of being directly connected to the second terminal 122b.

Seventh Embodiment

Figure 19:
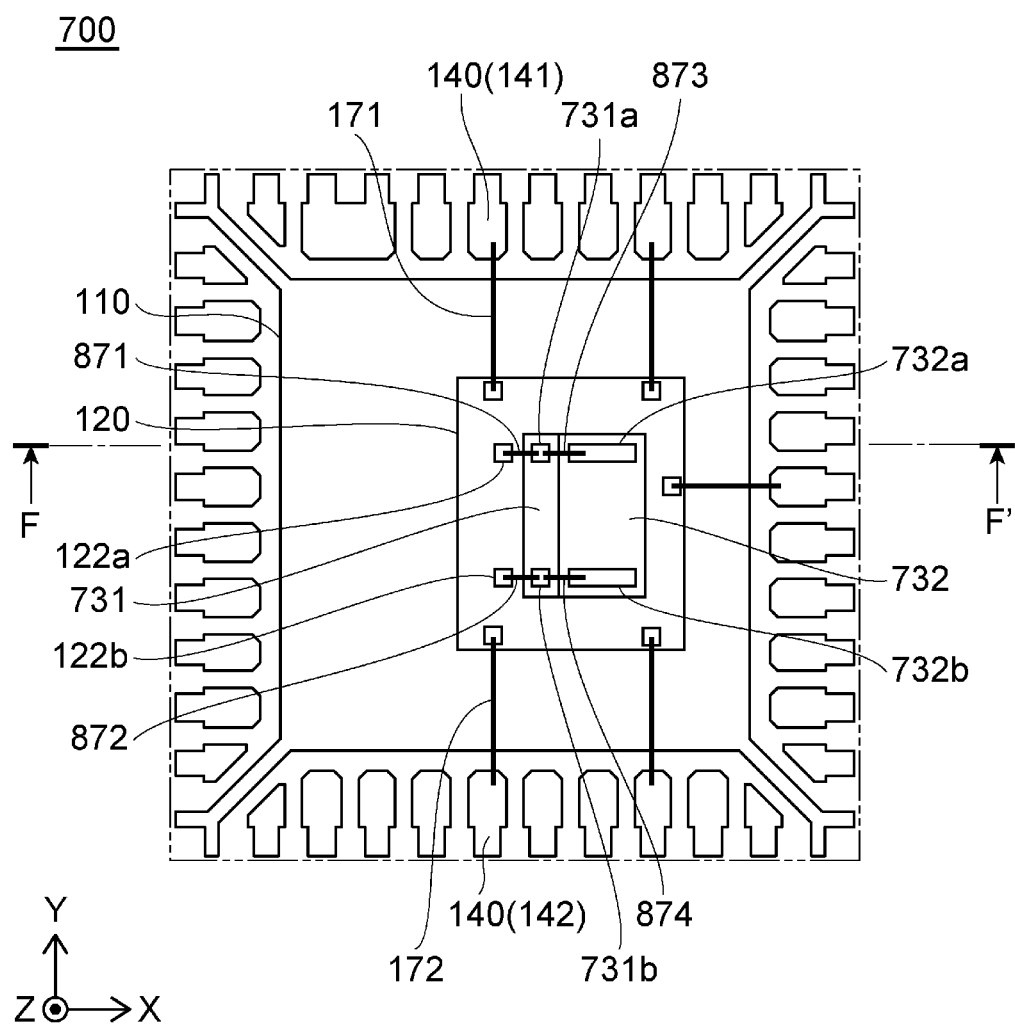
FIG. 19 is a top view illustrating a semiconductor device according to a seventh embodiment.

FIG. 19 is a top view illustrating a semiconductor device according to the seventh embodiment.

Figure 20:
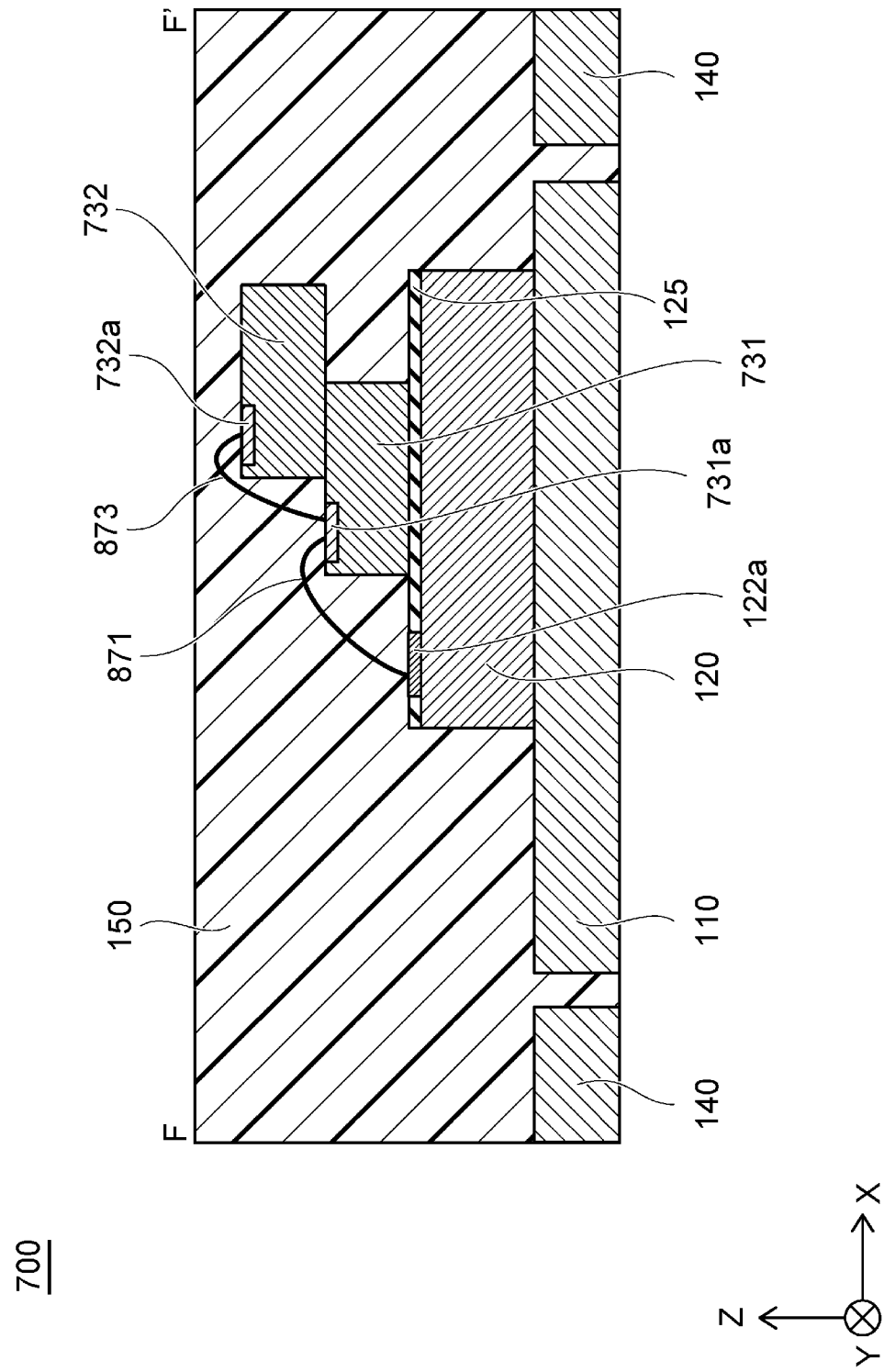
FIG. 20 is a cross-sectional view taken along line F-F' of FIG. 19.

FIG. 20 is a cross-sectional view taken along line F-F' of FIG. 19.

A semiconductor device 700 according to the seventh embodiment is different from the semiconductor device 600 according to the sixth embodiment in that it includes two silicon capacitors 731 and 732, and these two silicon capacitors 731 and 732 are disposed on the IC chip 120. The silicon capacitor 731 will be referred to as "first silicon capacitor 731", and the silicon capacitor 732 will be referred to as "second silicon capacitor 732".

In the following description, primarily the differences from the sixth embodiment will be described. Features of the seventh embodiment other than those described below are substantially the same as the sixth embodiment.

As illustrated in FIG. 20, the first silicon capacitor 731 is disposed on the IC chip 120. As illustrated in FIG. 19, a first external electrode 731a and a second external electrode 731b are provided on an upper surface of the first silicon capacitor 731. The first external electrode 731a is connected to the first terminal 122a of the IC chip 120 through a first bonding wire 871. The second external electrode 731b is connected to the second terminal 122b of the IC chip 120 through a second bonding wire 872.

As illustrated in FIG. 20, the second silicon capacitor 732 is disposed on the first silicon capacitor 731. The second silicon capacitor 732 has the same configuration as the silicon capacitor 130, except that a third external electrode 732a corresponding to the first external electrode 138 and a fourth external electrode 732b corresponding to the second external electrode 139 are arranged to face upward.

The third external electrode 732a is electrically connected to the first external electrode 731a through a bonding wire 873. The fourth external electrode 732b is electrically connected to the second external electrode 731b through a bonding wire 874. The sealing member 150 seals the first silicon capacitor 731 and the second silicon capacitor 732.

As described above, in the semiconductor device 700 according to the seventh embodiment, the first silicon capacitor 731 is provided on the IC chip 120. When the semiconductor device 700 is used, the first silicon capacitor 731 can prevent noise from being transferred to a member to which the IC chip 120 is connected.

In addition, the semiconductor device 700 further includes the second silicon capacitor 732 that is provided on the first silicon capacitor 731 and includes: the third external electrode 732a electrically connected to the first external electrode 731a; and the fourth external electrode 732b electrically connected to the second external electrode 731b. In this way, by providing the first silicon capacitor 731 and the second silicon capacitor 732, the overall capacitance of the capacitor can increase.

Eighth Embodiment

Figure 21:
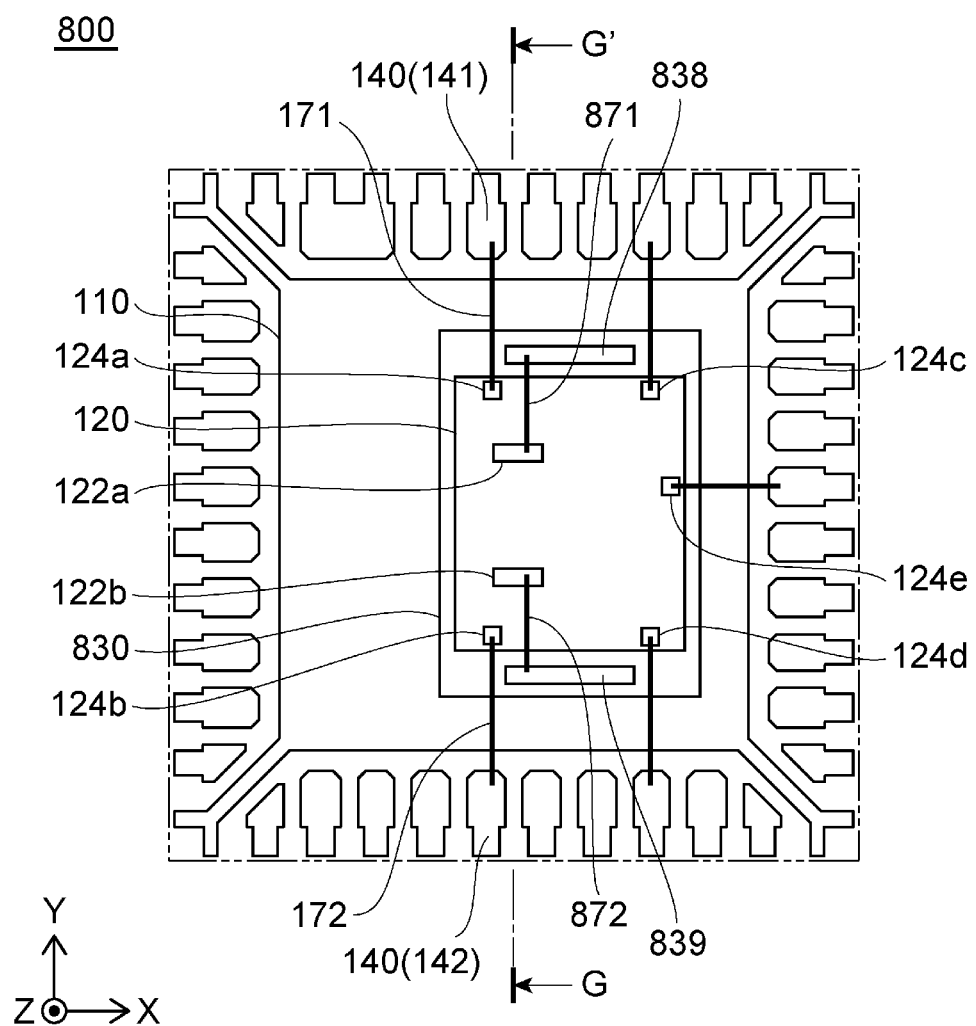
FIG. 21 is a top view illustrating a semiconductor device according to an eighth embodiment.

FIG. 21 is a top view illustrating a semiconductor device according to the eighth embodiment.

Figure 22:
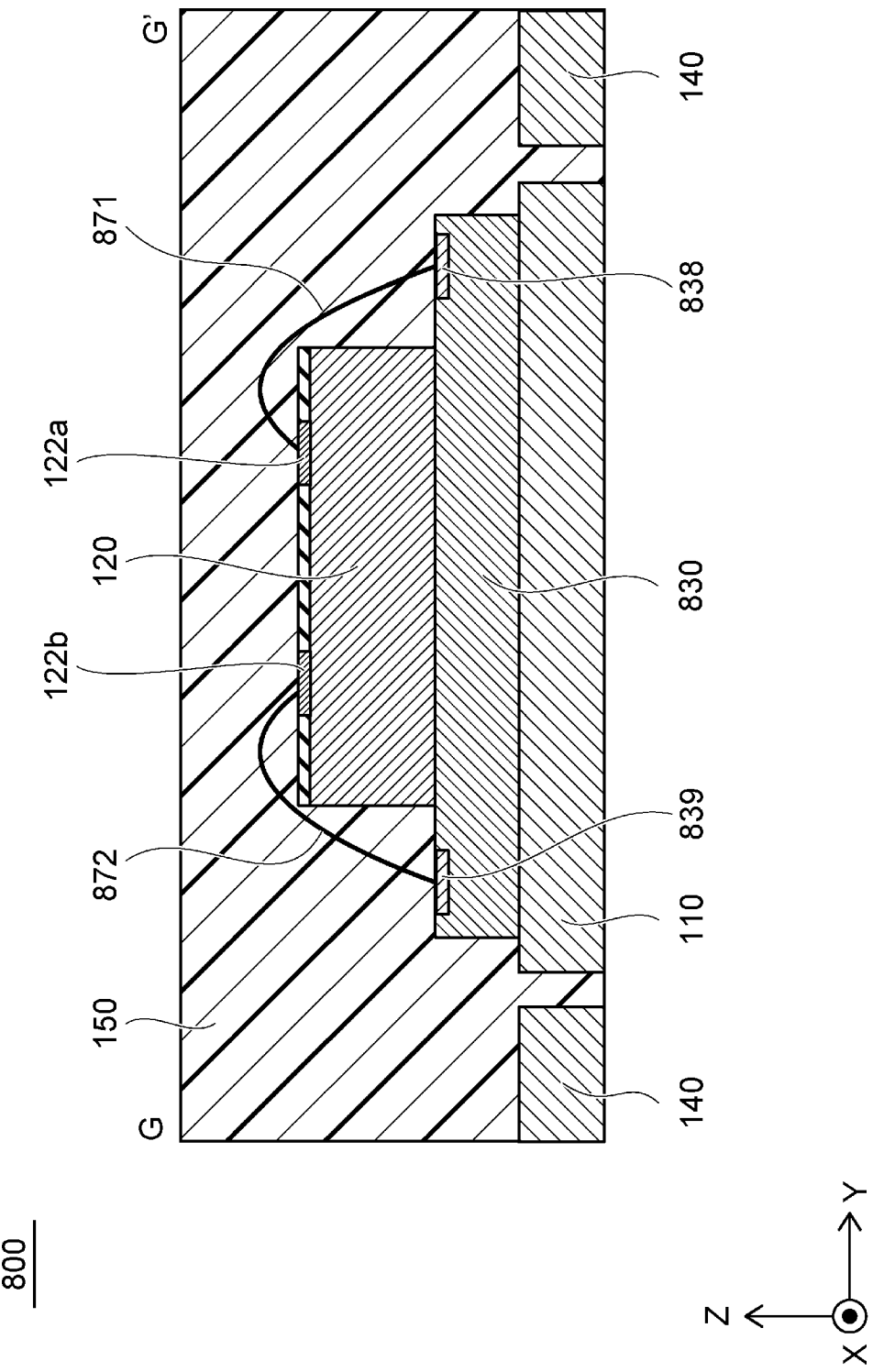
FIG. 22 is a cross-sectional view taken along line G-G' of FIG. 21.

FIG. 22 is a cross-sectional view taken along line G-G' of FIG. 21.

A semiconductor device 800 according to the eighth embodiment is different from the semiconductor device 600 according to the sixth embodiment in that a silicon capacitor 830 is disposed between the die pad 110 and the IC chip 120.

The silicon capacitor 830 has a similar configuration as the silicon capacitor 130 according to the first embodiment, except that the planar area of the silicon capacitor 830 is greater than the planar area of the IC chip 120 in a top view and that a first external electrode 838 and a second external electrode 839 are arranged between the die pad 110 and the IC chip 120 to face upward. The first external electrode 838 of the silicon capacitor 830 is electrically connected to the first terminal 122a of the IC chip 120 through the first bonding wire 871. The second external electrode 839 of the silicon capacitor 830 is electrically connected to the second terminal 122b of the IC chip 120 through a second bonding wire 872. The IC chip 120 can be electrically connected to the die pad 110 through, for example, a bonding wire.

In the semiconductor device 800 according to the eighth embodiment, the silicon capacitor 830 is provided between the IC chip 120 and the die pad 110. The silicon capacitor 830 can prevent noise from being transferred to a member to which the IC chip 120 is connected.

In addition, in the semiconductor device 800, the size of the silicon capacitor 830 is greater than the size of the IC chip 120 in a top view. Therefore, the capacitance of the silicon capacitor 830 can be increased.

The respective configurations of the described embodiments may be appropriately combined. For example, in a semiconductor device 600 according to the sixth embodiment, one or more inductors may be provided as in the second embodiment. In addition, the silicon capacitor 630 in the semiconductor device 600 according to the sixth embodiment may be configured to be like the silicon capacitor 330 according to the third embodiment.

While certain embodiments have been described, these embodiments have been presented by way of example only, and are not intended to limit the scope of the disclosure. Indeed, the novel embodiments described herein may be embodied in a variety of other forms; furthermore various omissions, substitutions and changes in the form of the embodiments described herein may be made without departing from the spirit of the disclosure. The accompanying claims and their equivalents are intended to cover such embodiments or modifications as would fall within the scope and spirit of the disclosure.

What is claimed is:

1. A semiconductor device, comprising:
an integrated circuit (IC) chip having a first terminal and a second terminal on a first surface of the IC chip;

a first silicon capacitor on the first surface, the first silicon capacitor having a first electrode and a second electrode on a second surface of the first silicon capacitor that faces the first surface of the IC chip, the first electrode being electrically connected to the first terminal through a first conductive member, and the second electrode being electrically connected to the second terminal through a second conductive member, wherein a third terminal is on the first surface of the IC chip, the second terminal is between the first terminal and the third terminal, the first electrode includes a first portion and a second portion, the first portion being electrically connected to the first terminal through the first conductive member, and the second portion being electrically connected to the third terminal through a third conductive member, and the second electrode includes a third portion between the first and second portions of the first electrode and electrically connected to the second terminal through the second conductive member.

2. The semiconductor device according to claim 1, further comprising:

a die pad on which the IC chip is mounted;

a first lead electrically connected to the first terminal;

a second lead electrically connected to the second terminal; and a sealing resin covering the IC chip and the first silicon capacitor.

3. The semiconductor device according to claim 1, wherein the IC chip includes a first circuit electrically connected to the first terminal and the second terminal, and the first silicon capacitor is positioned directly above the first circuit.

4. The semiconductor device according to claim 1, further comprising:

a second silicon capacitor on the first surface and having a third electrode and a fourth electrode on a third surface that faces the first surface;

a fourth terminal on the first surface of the IC chip;

a fifth terminal on the first surface of the IC chip, wherein the third electrode is electrically connected to the fourth terminal through a fourth conductive member, and the fourth electrode is electrically connected to the fifth terminal through a fifth conductive member.

5. The semiconductor device according to claim 2, further comprising:

an inductor electrically connected to the first terminal and the first lead and covered by the sealing resin.

6. The semiconductor device according to claim 4, wherein the IC chip further includes a second circuit electrically connected to the fourth terminal and the fifth terminal, and the second silicon capacitor is positioned directly above the second circuit.

7. The semiconductor device according to claim 4, wherein the first and third electrodes are either a positive electrode or a negative electrode, the second fourth electrodes are the other one of a positive electrode or a negative electrode opposite of the first and third electrodes, and a direction from the first electrode toward the second electrode is opposite to a direction from the third electrode toward the fourth electrode.

8. A semiconductor device, comprising:

a die pad;

an integrated circuit (IC) chip on the die pad and having a first terminal and a second terminal;

a first silicon capacitor including a first electrode and a second electrode, the first electrode being electrically connected to the first terminal through a first wiring member, and the second electrode being electrically connected to the second terminal through a second wiring member;

a first lead electrically connected to the first terminal;

a second lead electrically connected to the second terminal; and a sealing resin covering the IC chip and the first silicon capacitor, wherein the first silicon capacitor is between the IC chip and the die pad, and a planar area of the first silicon capacitor is greater than a planar area of the IC chip when viewed in a plan view.

9. The semiconductor device according to claim 8, wherein the first silicon capacitor is on the die pad.

10. The semiconductor device according to claim 8, wherein the IC chip is above the first silicon capacitor.

11. A semiconductor device, comprising:

a die pad;

an integrated circuit (IC) chip on the die pad and having a first terminal and a second terminal;

a first silicon capacitor including a first electrode and a second electrode, the first electrode being electrically connected to the first terminal through a first wiring member, and the second electrode being electrically connected to the second terminal through a second wiring member;

a first lead electrically connected to the first terminal;

a second lead electrically connected to the second terminal;

a sealing resin covering the IC chip and the first silicon capacitor; and a second silicon capacitor on the first silicon capacitor and including a third electrode and a fourth electrode, the third electrode being electrically connected to the first electrode, and the fourth electrode being electrically connected to the second electrode.

* * * * *